(12) United States Patent
Kim et al.

(10) Patent No.: US 11,730,020 B2
(45) Date of Patent: Aug. 15, 2023

(54) DISPLAY DEVICE

(71) Applicant: Samsung Display Co., Ltd., Yongin-si (KR)

(72) Inventors: Cha Dong Kim, Seoul (KR); Hee Na Kim, Hwaseong-si (KR); In Kyung Yoo, Hwaseong-si (KR); Sang Jin Lee, Pohang-si (KR); Chong Sup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 232 days.

(21) Appl. No.: 17/342,770

(22) Filed: Jun. 9, 2021

(65) Prior Publication Data
US 2021/0399069 A1    Dec. 23, 2021

(30) Foreign Application Priority Data
Jun. 18, 2020    (KR) .................. 10-2020-0074245

(51) Int. Cl.
*H01L 21/00*    (2006.01)
*H10K 59/122*    (2023.01)
*H10K 59/88*    (2023.01)
*H10K 59/131*    (2023.01)

(52) U.S. Cl.
CPC ......... *H10K 59/122* (2023.02); *H10K 59/131* (2023.02); *H10K 59/88* (2023.02)

(58) Field of Classification Search
CPC .................................................. H10K 59/122
See application file for complete search history.

(56) References Cited

U.S. PATENT DOCUMENTS

| | | | |
|---|---|---|---|
| 2021/0111364 A1* | 4/2021 | Sakamoto | H10K 50/826 |
| 2021/0151544 A1* | 5/2021 | Kim | H10K 59/38 |
| 2021/0183986 A1* | 6/2021 | Shin | H10K 59/38 |
| 2021/0183991 A1* | 6/2021 | Shin | H10K 59/38 |
| 2021/0191552 A1* | 6/2021 | Bok | G06F 1/1652 |
| 2021/0327362 A1* | 10/2021 | Park | H10K 59/131 |
| 2022/0085135 A1* | 3/2022 | Ukigaya | H10K 59/131 |

FOREIGN PATENT DOCUMENTS

KR    10-2013-0099045 A    9/2013

\* cited by examiner

*Primary Examiner* — Douglas M Menz
(74) *Attorney, Agent, or Firm* — Lewis Roca Rothgerber Christie LLP

(57) ABSTRACT

A display device includes a first substrate including a display area and a non-display area, first banks spaced apart from each other in the display area and in the non-display area on the first substrate, electrodes spaced apart from each other on the first banks in the display area, dummy electrodes spaced apart from each other on the first banks in the non-display area, a first pattern between the electrodes in the display area, a second pattern between the dummy electrodes in the non-display area, a first light emitting element on the first pattern, a second light emitting element on the second pattern, contact electrodes respectively on the electrodes in the display area to contact one end of the first light emitting element, and dummy contact electrodes respectively on the dummy electrodes in the non-display area to contact one end of the second light emitting element.

20 Claims, 15 Drawing Sheets

DISPLAY DEVICE

CROSS-REFERENCE TO RELATED APPLICATION

This application claims priority to, and the benefit of, Korean Patent Application No. 10-2020-0074245 filed on Jun. 18, 2020 in the Korean Intellectual Property Office, the contents of which in its entirety are herein incorporated by reference.

BACKGROUND

1. Field

The present disclosure relates to a display device.

2. Description of the Related Art

The importance of display devices has steadily increased with the development of multimedia technology. Accordingly, various types of display devices, such as an organic light emitting display (OLED), a liquid crystal display (LCD) and the like, have been used.

A display device is a device for displaying an image, and includes a display panel, such as an organic light emitting display panel or a liquid crystal display panel. Among them, a light emitting display panel may include a light emitting element. Examples of a light emitting diode (LED) include an organic light emitting diode (OLED) using an organic material as a fluorescent material, and an inorganic light emitting diode using an inorganic material as a fluorescent material.

SUMMARY

Aspects of the present disclosure provide a display device capable of monitoring the height, alignment degree, and luminance of light emitting elements formed in sub-pixels in a display area.

However, aspects of the present disclosure are not restricted to the one set forth herein. The above and other aspects of the present disclosure will become more apparent to one of ordinary skill in the art to which the present disclosure pertains by referencing the detailed description given below.

In the display device according to embodiments, a dummy pixel having no circuit structure is formed in a non-display area, and the alignment degree and luminance of a light emitting element in the dummy pixel are measured, thereby more accurately measuring and monitoring the height, alignment degree, and luminance of the light emitting elements in the sub-pixels in the display area.

The aspects of the present disclosure are not limited to the aforementioned effects, and various other aspects are included in the present specification.

According to some embodiments of the present disclosure, a display device includes a first substrate including a display area and a non-display area, first banks spaced apart from each other in the display area and in the non-display area on the first substrate, electrodes spaced apart from each other on the first banks in the display area, dummy electrodes spaced apart from each other on the first banks in the non-display area, a first pattern between the electrodes in the display area, a second pattern between the dummy electrodes in the non-display area, a first light emitting element on the first pattern, a second light emitting element on the second pattern, contact electrodes respectively on the electrodes in the display area to contact one end of the first light emitting element, and dummy contact electrodes respectively on the dummy electrodes in the non-display area to contact one end of the second light emitting element.

The dummy electrodes, the second pattern, the second light emitting element, and the dummy contact electrodes may be included in at least one dummy pixel.

The dummy pixel may be in the non-display area, and may be adjacent to at least one corner of the display area.

The at least one dummy pixel may include four dummy pixels that are respectively adjacent to four corners of the display area.

The dummy electrodes may include a first dummy electrode, and a second dummy electrode spaced apart from the first dummy electrode, wherein one end of the first dummy electrode and one end of the second dummy electrode overlaps the second light emitting element.

The display device may further include a lighting pad portion in the non-display area, and including a first dummy pad electrode, and a second dummy pad electrode spaced apart from the first dummy pad electrode.

The display device may further include a first dummy line connecting the first dummy pad electrode to the first dummy electrode, and a second dummy line connecting the second dummy pad electrode to the second dummy electrode, wherein the first and second dummy lines are between the lighting pad portion and the dummy pixel.

At least one of the electrodes may overlap a transistor on the first substrate, and wherein at least one of the dummy electrodes does not overlap the transistor.

The first pattern may cover one end of the electrodes, wherein the second pattern covers one end of the dummy electrodes.

The first pattern may be in plural number between the electrodes, wherein the second pattern is in plural number between the dummy electrodes.

The electrodes and the dummy electrodes are to extend in one direction, wherein the second pattern is in plural number in a direction crossing the one direction.

According to some embodiments of the present disclosure, a display device includes a first substrate including a display area and a non-display area, the non-display area including a dummy pixel and a lighting pad portion, wherein the dummy pixel includes first banks on the first substrate and spaced apart from each other, dummy electrodes on the first banks and spaced apart from each other, a second pattern between the dummy electrodes, a light emitting element on the second pattern, and dummy contact electrodes respectively on the dummy electrodes to contact the light emitting element, and wherein the lighting pad portion includes dummy lines connected to the dummy electrodes on the first substrate, and dummy pad electrodes on the dummy lines and connected to the dummy lines.

The display device may further include at least one signal line on the first substrate in the non-display area, wherein the dummy lines and the at least one signal line are insulated from each other and cross each other.

The dummy pixel might not overlap the at least one signal line.

The dummy electrodes may include a first dummy electrode, and a second dummy electrode spaced apart from the first dummy electrode, wherein the dummy lines include a first dummy line, and a second dummy line spaced apart from the first dummy line, and wherein the dummy pad electrodes include a first dummy pad electrode, and a second dummy pad electrode spaced apart from the first dummy pad electrode.

The first dummy electrode may be connected to the first dummy pad electrode through the first dummy line, wherein the second dummy electrode is connected to the second dummy pad electrode through the second dummy line.

The display device may further include at least one insulating layer between the first dummy pad electrode and the first dummy line, and between the second dummy pad electrode and the second dummy line, wherein the first and second dummy pad electrodes are respectively connected to the first and second dummy lines through contact holes penetrating the insulating layer.

The second pattern may be in plural number between the dummy electrodes.

The dummy electrodes may extend in one direction, wherein the second pattern is in plural number in a direction crossing the one direction.

The light emitting element may include a first semiconductor layer, a second semiconductor layer, and at least one light emitting layer between the first semiconductor layer and the second semiconductor layer, wherein the first semiconductor layer, the second semiconductor layer, and the at least one light emitting layer are surrounded by an insulating film.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
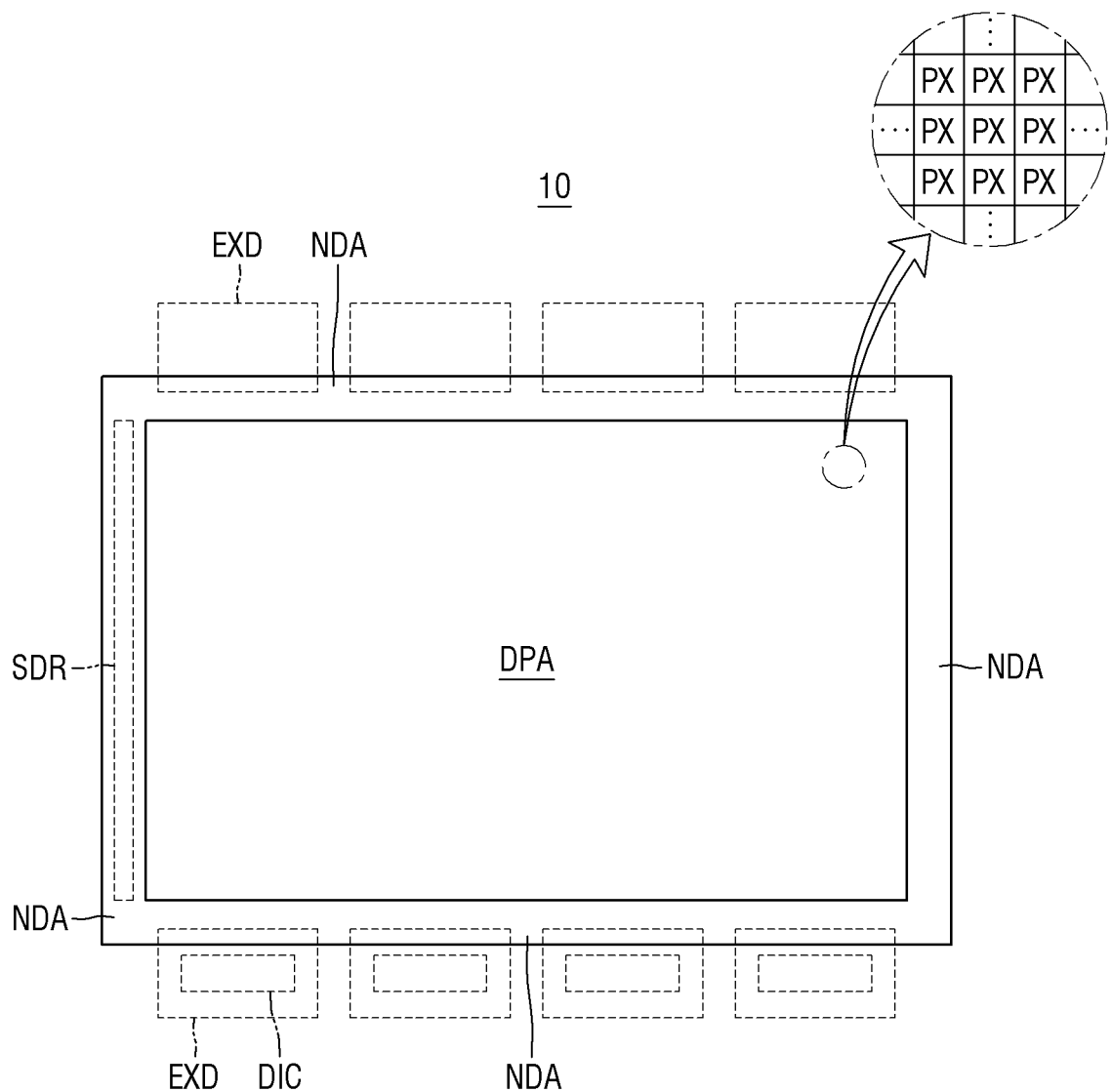
FIG. 1 is a schematic plan view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device according to some embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which provide a display screen.

The display device 10 includes a display panel, which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the present disclosure is not limited thereto, and other display panels may be applied within the scope of the same technical ideas.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device 10.

The display area DPA may include a plurality of pixels PX. The plurality of pixels PX may be arranged in a matrix. The shape of each pixel PX may be a rectangular or square shape in a plan view. However, the present disclosure is not limited thereto, and it may be a rhombic shape in which each side is inclined with respect to one direction. The pixels PX may be alternately arranged in a stripe type or a PenTile®/PENTILE® type (PENTILE® is a registered trademark owned by Samsung Display Co., Ltd.). In addition, each of the pixels PX may include one or more light emitting elements 30 that emit light of a corresponding wavelength band to display a corresponding color.

The non-display area NDA may be located around the display area DPA. The non-display area NDA may completely or partially surround the display area DPA. The display area DPA may have a rectangular shape, and the non-display area NDA may be adjacent to four sides of the display area DPA. The non-display area NDA may form a bezel of the display device 10.

A driving circuit or a driving element for driving the display area DPA may be located in the non-display area NDA. In some embodiments, pad portions located on a display substrate of the display device 10 may be provided in the non-display area NDA adjacent to a first long side (lower side in FIG. 1) of the display device 10 and in the non-display area NDA adjacent to a second long side (upper side in FIG. 1) of the display device 10. External devices EXD may be mounted on pad electrodes of the pad portions. The external devices EXD may include, for example, a connection film, a printed circuit board, a driver integrated circuit (DIC), a connector, a wire connection film and the like. A scan driver SDR directly formed on the display substrate of the display device 10 may be provided in the non-display area NDA adjacent to a first short side (left side in FIG. 1) of the display device 10.

Figure 2:
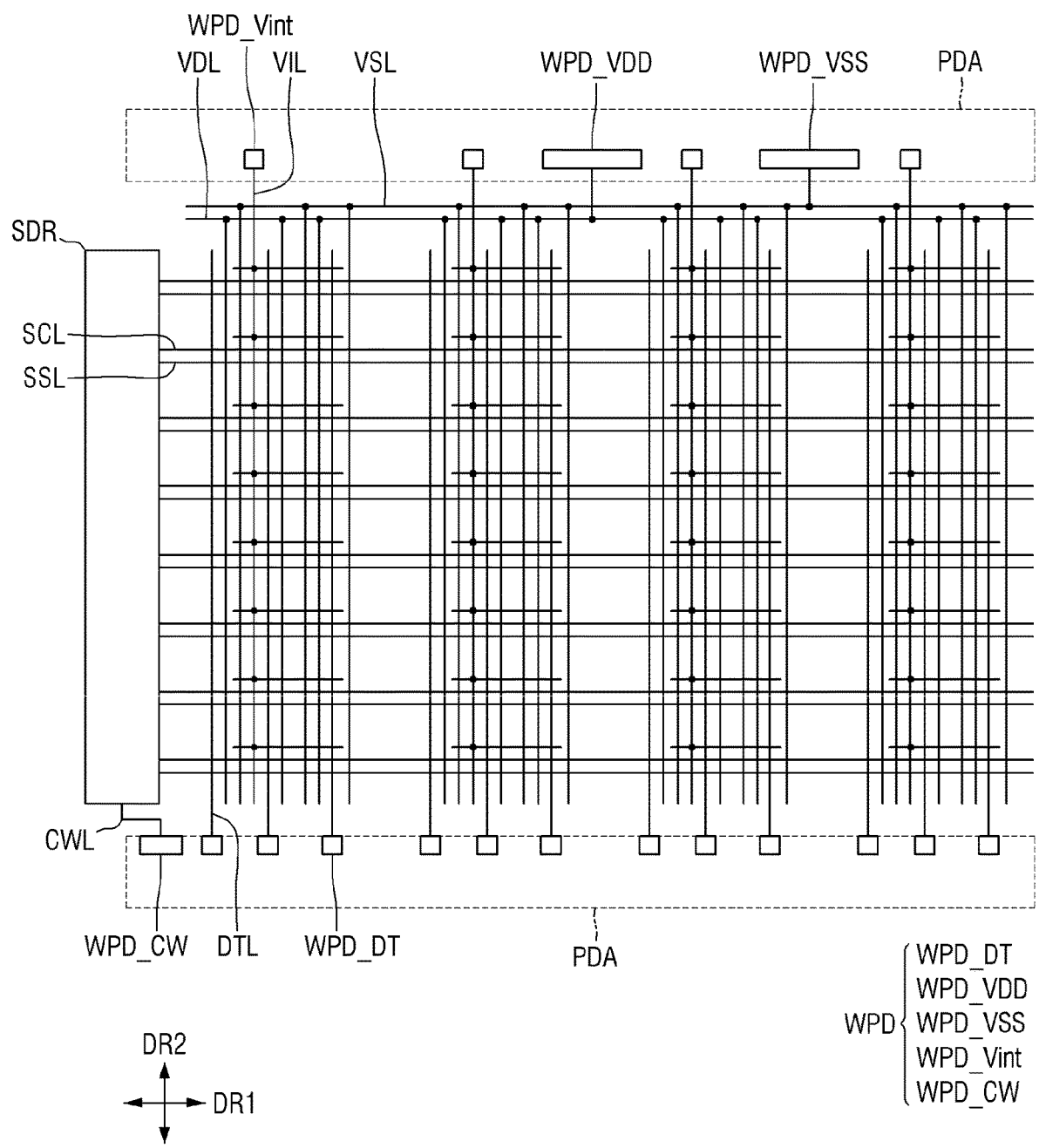
FIG. 2 is a schematic layout diagram showing wires included in a display device according to some embodiments.

FIG. 2 is a schematic layout diagram showing wires included in a display device according to some embodiments.

Referring to FIG. 2, the display device 10 may include a plurality of wires. The plurality of wires may include a scan line SCL, a sensing line SSL, a data line DTL, an initialization voltage line VIL, a first voltage line VDL, a second voltage line VSL, and the like. In various embodiments, other lines may be further provided in the display device 10 as well.

The scan line SCL and the sensing line SSL may extend in a first direction DR1. The scan line SCL and the sensing line SSL may be connected to the scan driver SDR. The scan driver SDR may include a driving circuit. The scan driver SDR may be arranged on one side of the display area DPA in the first direction DR1, but is not limited thereto. The scan driver SDR may be connected to a signal connection line CWL, and at least one end of the signal connection line CWL may form a pad WPD_CW in the non-display area NDA to be connected to the external device.

Meanwhile, the term "connected" as used herein may mean not only that one member is connected to another member through a physical contact, but also that one member is connected to another member through yet another member. Further, it can be understood that one part and another part are connected to each other into one integrated member. Furthermore, the connection between one member and another member may be interpreted as including not only a direct contact connection but also an electrical connection through yet another member.

The data line DTL and the initialization voltage line VIL may extend in a second direction DR2 crossing the first direction DR1. The initialization voltage line VIL may further include, in addition to a portion extending in the second direction DR2, a portion branched in the first direction DR1 therefrom. The first voltage line VDL and the second voltage line VSL may also include a portion extending in the second direction DR2, and a portion connected thereto to extend in the first direction DR1. The first voltage line VDL and the second voltage line VSL may have a mesh structure, but are not limited thereto. Although not shown in the drawing, each pixel PX of the display device 10 may be connected to at least one data line DTL, the initialization voltage line VIL, the first voltage line VDL, and the second voltage line VSL.

The data line DTL, the initialization voltage line VIL, the first voltage line VDL, and the second voltage line VSL may be electrically connected to at least one wiring pad WPD. Each wiring pad WPD may be located in the non-display area NDA. In some embodiments, a wiring pad WPD_DT (hereinafter, referred to as "data pad") of the data line DTL may be located in a pad area PDA located on one side of the display area DPA in the second direction DR2. Further, a wiring pad WPD_Vint (hereinafter, referred to as "initialization voltage pad") of the initialization voltage line VIL, a wiring pad WPD_VDD (hereinafter, referred to as "first power pad") of the first voltage line VDL, and a wiring pad WPD_VSS (hereinafter, referred to as "second power pad") of the second voltage line VSL, may be located in a pad area PDA located on the other side of the display area DPA in the second direction DR2. As another example, the data pad WPD_DT, the initialization voltage pad WPD_Vint, the first power pad WPD_VDD, and the second power pad WPD_VSS may all be located in the same area (e.g., in the non-display area NDA located above the display area DPA). The external devices EXD may be mounted on the wiring pads WPD. The external devices EXD may be mounted on the wiring pads WPD by applying an anisotropic conductive film, ultrasonic bonding or the like.

Each pixel PX or sub-pixel PXn (n being an integer, for example, 1, 2, or 3) of the display device 10 includes a pixel driving circuit. The above-described wirings may respectively pass through each pixel PX or the periphery thereof to apply a driving signal to each pixel driving circuit. The pixel driving circuit may include at least one transistor and at least one capacitor. The number of transistors and capacitors of each pixel driving circuit may be variously modified. According to some embodiments, in each sub-pixel PXn of the display device 10, the pixel driving circuit may have a 3T1C structure including three transistors and one capacitor.

Hereinafter, the pixel driving circuit of the 3T1C structure will be described as an example, but the present disclosure is not limited thereto, and various other modified pixel PX structures such as a 2T1C structure, a 7T1C structure, and a 6T1C structure may be applied.

Figure 3:
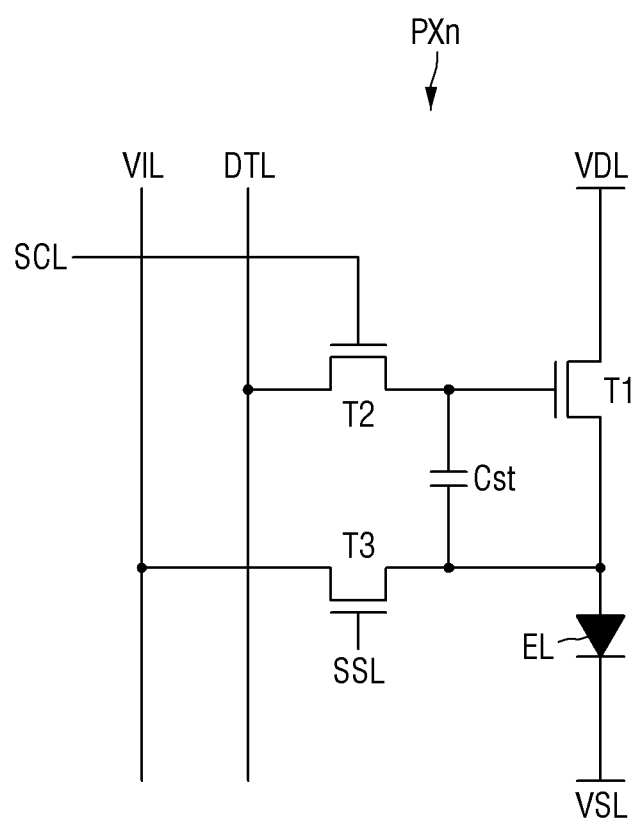
FIG. 3 is an equivalent circuit diagram of a sub-pixel according to some embodiments.

FIG. 3 is an equivalent circuit diagram of a sub-pixel according to some embodiments.

Referring to FIG. 3, each sub-pixel PXn of the display device 10 according to some embodiments includes three transistors T1, T2 and T3 and one storage capacitor Cst in addition to a light emitting diode EL.

The light emitting diode EL emits light by a current supplied through a first transistor T1. The light emitting diode EL includes a first electrode, a second electrode, and at least one light emitting element located between them. The light emitting element may emit light of a corresponding wavelength band due to electrical signals transmitted from the first electrode and the second electrode.

One end of the light emitting diode EL may be connected to the source electrode of the first transistor T1, and the other end thereof may be connected to the second voltage line VSL to which a low potential voltage (hereinafter, a second power voltage) that is lower than a high potential voltage (hereinafter, a first power voltage) of the first voltage line VDL is supplied.

The first transistor T1 adjusts a current flowing from the first voltage line VDL, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VDL to which the first power voltage is applied.

The second transistor T2 is turned on by a scan signal of the scan line SCL to connect the data line DTL to the gate electrode of the first transistor T1. The gate electrode of the second transistor T2 may be connected to the scan line SCL, the source electrode thereof may be connected to the gate electrode of the first transistor T1, and the drain electrode thereof may be connected to the data line DTL.

The third transistor T3 is turned on by a sensing signal of the sensing line SSL to connect the initialization voltage line VIL to one end of the light emitting diode EL. The gate electrode of the third transistor T3 may be connected to the sensing line SSL, the drain electrode thereof may be connected to the initialization voltage line VIL, and the source electrode thereof may be connected to one end of the light emitting diode EL or to the source electrode of the first transistor T1.

In some embodiments, the source electrode and the drain electrode of each of the transistors T1, T2, and T3 are not limited to those described above, and vice versa.

The storage capacitor Cst is formed between the gate electrode and the source electrode of the first transistor T1. The storage capacitor Cst stores a difference voltage between a gate voltage and a source voltage of the first transistor T1.

Each of the transistors T1, T2, and T3 may be formed of a thin film transistor. In addition, in FIG. 3, each of the transistors T1, T2, and T3 has been described as being formed of an N-type metal oxide semiconductor field effect transistor (MOSFET), but the present disclosure is not limited thereto. For example, each of the transistors T1, T2, and T3 may be formed of a P-type MOSFET. Alternatively, some of the transistors T1, T2, and T3 may be formed of an N-type MOSFET while others may be formed of a P-type MOSFET.

Figure 4:
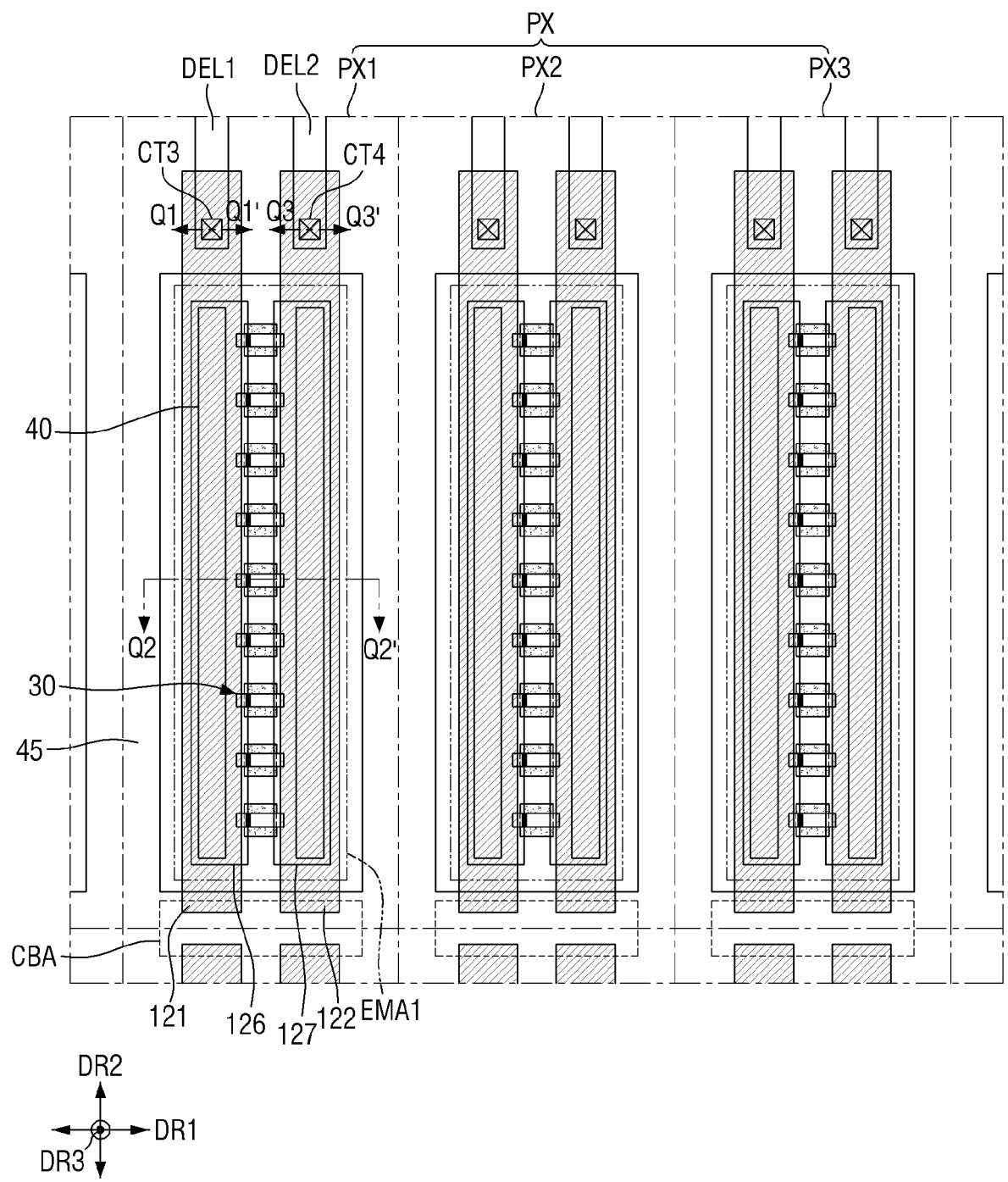
FIG. 4 is a plan view illustrating a pixel of a display device according to some embodiments.

FIG. 4 is a plan view illustrating a pixel of a display device according to some embodiments.

Referring to FIG. 4, each of the plurality of pixels PX may include a plurality of sub-pixels PXn (n being an integer of 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the sub-pixels PXn may emit light of the same color. In addition, although FIG. 4 illustrates that the pixel PX includes three sub-pixels PXn, the present disclosure is not limited thereto, and the pixel PX may include a larger number of sub-pixels PXn.

Each sub-pixel PXn of the display device 10 may include a first emission area EMA1 and a non-emission area. In the first emission area EMA1, the light emitting element 30 is located to emit light of a corresponding wavelength band. In the non-emission area, the light emitting element 30 is not located, and little to no light of the light emitted from the light emitting element 30 reaches the non-emission area, so that no light is emitted therefrom. The emission area may include an area in which the light emitting element 30 is located, and an area adjacent to the light emitting element 30 to emit lights emitted from the light emitting element 30. The present disclosure is not limited thereto, and, in other embodiments, the emission area may also include an area in which light emitted from the light emitting element 30 is reflected or refracted by another member and emitted to be transmitted. The plurality of light emitting elements 30 may be located in each sub-pixel PXn, and the emission area may be formed to include an area where the light emitting elements 30 are located, and an area adjacent thereto.

Further, each sub-pixel PXn may include a cut area CBA located in the non-emission area. The cut area CBA may be located on one side of the first emission area EMA1 in the second direction DR2. The cut area CBA may be located between the first emission areas EMA1 of sub-pixels PXn that are adjacent in the second direction DR2. A plurality of first emission areas EMA1 and cut areas CBA may be arranged in the display area DPA of the display device 10. For example, while the plurality of first emission areas EMA1 and cut areas CBA may be respectively arranged repeatedly in the first direction DR1, the first emission areas EMA1 and the cut areas CBA may be arranged alternately in the second direction DR2. In addition, the separation distance between the cut areas CBA in the first direction DR1 may be smaller than the separation distance between the first emission areas EMA1 in the first direction DR1.

A second bank 45 is located between the cut areas CBA and between the first emission areas EMA1, and respective separation distances between the cut areas CBA and between the first emission areas EMA1 may vary depending on the width of the second bank 45. Although light is not emitted from the cut area CBA because no light emitting element 30 is located therein, a portion of electrodes 21 and 22 provided in each sub-pixel PXn may be located in the cut area CBA (e.g., see FIG. 5). The electrodes 21 and 22 provided in each sub-pixel PXn may be located separately from each other in the cut area CBA.

Figure 5:
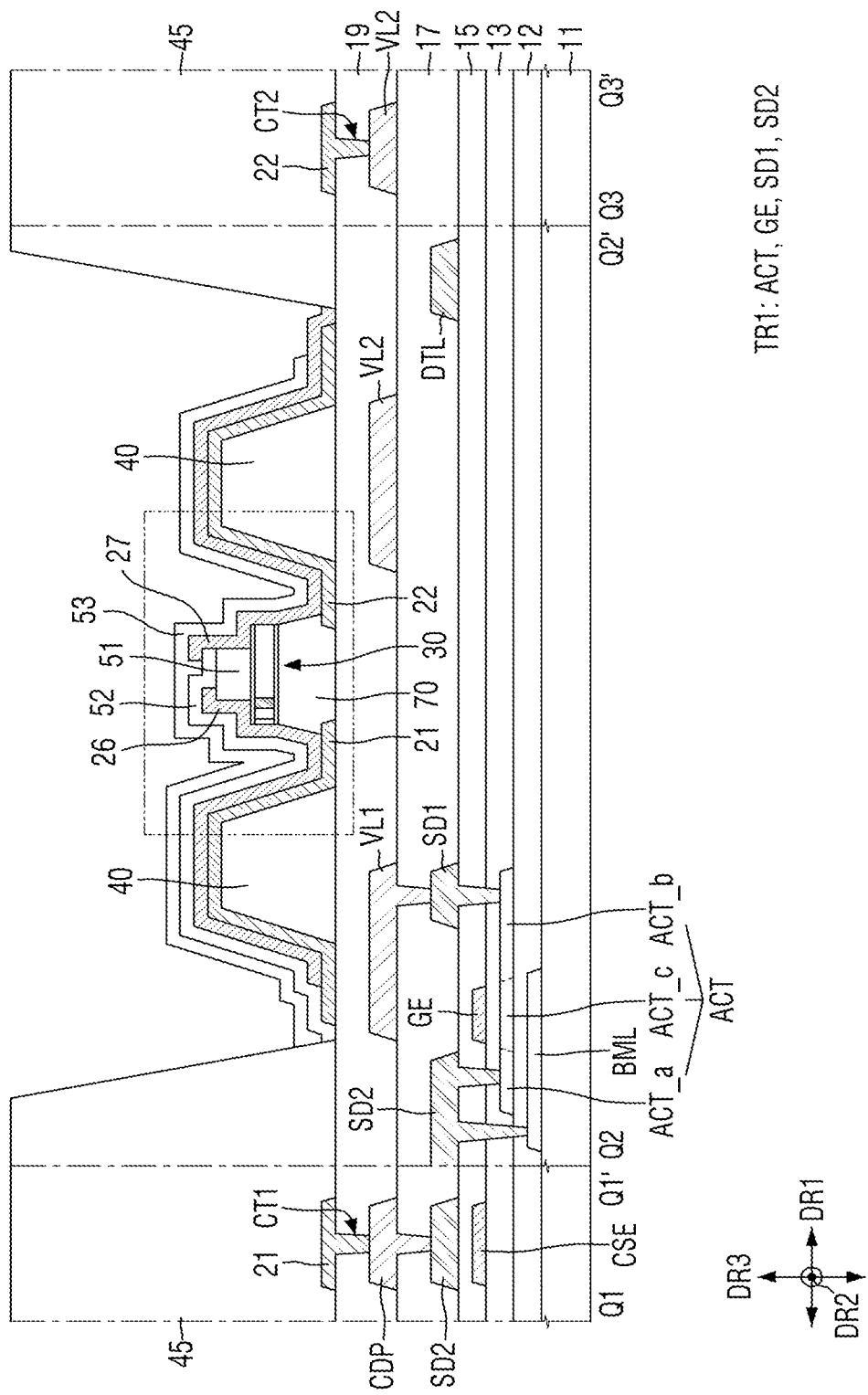
FIG. 5 is a cross-sectional view taken along the lines Q1-Q1', Q2-Q2', and Q3-Q3' of FIG. 4.

FIG. 5 is a cross-sectional view taken along the lines Q1-Q1', Q2-Q2', and Q3-Q3' of FIG. 4. FIG. 5 only shows a cross section of the first sub-pixel PX1 of FIG. 4, but the same may be applied to other pixels PX or sub-pixels PXn. FIG. 5 shows a cross section passing through one end and the other end of the light emitting element 30 located in the first sub-pixel PX1.

Referring to FIG. 5 together with FIG. 4, the display device 10 may include a first substrate 11, a semiconductor layer located on the first substrate 11, a plurality of conductive layers, and a plurality of insulating layers.

For example, the first substrate 11 may be an insulating substrate. The first substrate 11 may be made of an insulating material such as glass, quartz, or polymer resin. Further, the first substrate 11 may be a rigid substrate, but may also be a flexible substrate which can be bent, folded or rolled.

A light blocking layer BML may be located on the first substrate 11. The light blocking layer BML is located to overlap, or to be overlapped by, an active layer ACT of a first transistor TR1 of the display device 10. The light blocking layer BML includes a material that blocks light, thereby reducing or preventing light entering the active layer ACT of the first transistor TR1. For example, the light blocking layer BML may be formed of an opaque metal material that blocks transmission of light. However, the present disclosure is not limited thereto, and in some cases, the light blocking layer BML may be omitted.

A buffer layer 12 may be located on the light blocking layer BML. The buffer layer 12 may be entirely located on the first substrate 11 including the light blocking layer BML. The buffer layer 12 may be formed on the first substrate 11 to protect the first transistors TR1 of the pixel PX from moisture permeating through the first substrate 11 that is susceptible to moisture permeation, and may perform a surface planarization function. The buffer layer 12 may be formed of a plurality of inorganic layers that are alternately stacked. For example, the buffer layer 12 may be formed of a multilayer in which inorganic layers including at least one of silicon oxide (SiOx), silicon nitride (SiNx), and silicon oxynitride (SiOxNy) are alternately stacked.

Meanwhile, in the drawing, only the first transistor TR1 among the transistors included in the sub-pixel PXn of the display device 10 is illustrated, but the present disclosure is not limited thereto. The display device 10 may include a larger number of transistors. For example, the display device 10 may include two or three transistors by further including one or more transistors in addition to the first transistor TR1 for each sub-pixel PXn.

The active layer ACT may be located on the buffer layer 12. The active layer ACT may be located to partially overlap a gate electrode GE of a first gate conductive layer to be described later.

In some embodiments, the active layer ACT may include polycrystalline silicon, monocrystalline silicon, an oxide semiconductor, or the like. When the active layer ACT includes the oxide semiconductor, a plurality of conductive regions ACTa and ACTb, and a channel region ACTc between the conductive regions ACTa and ACTb, may be included. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like.

In other embodiments, the active layer ACT may include polycrystalline silicon. The polycrystalline silicon may be formed by crystallizing amorphous silicon. In this case, the conductive regions of the active layer ACT may be regions doped with impurities.

A first gate insulating layer 13 may be located on the active layer ACT and the buffer layer 12. The first gate insulating layer 13 may include the active layer ACT and be located on the buffer layer 12. The first gate insulating layer 13 may function as a gate insulating film of each transistor. The first gate insulating layer 13 may be formed of an inorganic layer including an inorganic material, such as silicon oxide (SiOx), silicon nitride (SiNx) or silicon oxynitride (SiOxNy), or a stacked structure thereof.

A first gate conductive layer may be located on the first gate insulating layer 13. The first gate conductive layer may include the gate electrode GE of the first transistor TR1, and a first capacitor electrode CSE of a storage capacitor. The gate electrode GE may be located to overlap the channel region ACTc of the active layer ACT in the thickness direction. The first capacitor electrode CSE may be located to overlap, in the thickness direction, a first source/drain electrode SD1 of the first transistor TR1 to be described later. In some embodiments, the first capacitor electrode CSE may be integrally connected to the gate electrode GE, and the integrated layer may partially include the gate electrode GE and the first capacitor electrode CSE. The first capacitor electrode CSE may be located to overlap the first source/drain electrode SD1 in the thickness direction to form the storage capacitor therebetween.

The first gate conductive layer may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof. However, the present disclosure is not limited thereto.

A first protective layer 15 may be located on the first gate conductive layer. The first protective layer 15 may be located to cover the first gate conductive layer to function to protect it. The first protective layer 15 may be formed of an inorganic layer including an inorganic material, such as silicon oxide (SiOx), silicon nitride (SiNx), or silicon oxynitride (SiOxNy), or a stacked structure thereof.

A first data conductive layer may be located on the first protective layer 15. The first data conductive layer may include the first source/drain electrode SD1 and a second source/drain electrode SD2 of the first transistor TR1, and the data line DTL.

The source/drain electrodes SD1 and SD2 of the first transistor TR1 may contact the doped regions ACTb and ACTa of the active layer ACT, respectively, through contact holes penetrating the first protective layer 15 and the first gate insulating layer 13. In addition, the second source/drain electrode SD2 of the first transistor TR1 may be electrically connected to the light blocking layer BML through another contact hole penetrating the first protective layer 15, the first gate insulating layer 13 and the buffer layer 12.

The data line DTL may apply a data signal to another transistor included in the display device 10. In some embodiments, the data line DTL may be connected to a source/drain electrode of another transistor to transfer a signal applied from the data line DTL.

The first data conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A first interlayer insulating layer 17 may be located on the first data conductive layer. The first interlayer insulating layer 17 may function as an insulating film between the first data conductive layer and other layers located thereon. In addition, the first interlayer insulating layer 17 may cover the first data conductive layer, and may function to protect the first data conductive layer. The first interlayer insulating layer 17 may be formed of an inorganic layer including an inorganic material, such as silicon oxide (SiOx), silicon nitride (SiNx), or silicon oxynitride (SiOxNy), or a stacked structure thereof.

A second data conductive layer may be located on the first interlayer insulating layer 17. The second data conductive layer may include a first voltage line VL1, a second voltage line VL2, and a first conductive pattern CDP. The first voltage line VL1 may be applied with a high potential voltage (or a first source voltage) supplied to the first transistor TR1, and the second voltage line VL2 may be applied with a low potential voltage (or a second source voltage) supplied to the second electrode 22. Also, during the manufacturing process of the display device 10, the second voltage line VL2 may be applied with an alignment signal required to align the light emitting element 30.

The first conductive pattern CDP may be electrically connected to the second source/drain electrode SD2 of the first transistor TR1 through the contact hole formed in the first interlayer insulating layer 17. The first conductive pattern CDP may also be in contact with the first electrode 21 to be described later, and the first transistor TR1 may transfer the first source voltage applied from the first voltage line VL1 to the first electrode 21 through the first conductive pattern CDP. Meanwhile, although it is illustrated in the drawing that the second data conductive layer includes one second voltage line VL2 and one first voltage line VL1, the present disclosure is not limited thereto. The second data conductive layer may include a larger number of first voltage lines VL1 and second voltage lines VL2.

The second data conductive layer may be formed as a single layer or as multiple layers made of any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A first planarization layer 19 may be located on the second data conductive layer. The first planarization layer 19 may include an organic insulating material, for example, an organic material such as polyimide (PI), to perform a surface planarization function.

A plurality of first banks 40, a first pattern 70, the electrodes 21 and 22, the light emitting element 30, the second bank 45, and a plurality of contact electrodes 26 and 27 may be located on the first planarization layer 19. In addition, a plurality of insulating layers 51, 52, and 53 may be further located on the first planarization layer 19.

The plurality of first banks 40 may be directly located on the first planarization layer 19. The plurality of first banks 40, which extend in the second direction DR2 within each sub-pixel PXn without extending to other sub-pixels PXn adjacent in the second direction DR2, may be located in the first emission area EMA1. In addition, the plurality of first banks 40 may be located to be spaced apart from each other in the first direction DR1, and a region having the light emitting elements 30 may be formed in a space therebetween. The plurality of first banks 40 may be located for each sub-pixel PXn to form a linear pattern in the display area DPA of the display device 10. In the drawing, two first banks 40 are illustrated, but the present disclosure is not limited thereto. A larger number of first banks 40 may be further arranged according to the number of electrodes 21 and 22 to be described later.

The first bank 40 may have a structure in which at least a portion thereof protrudes from the top surface of the first planarization layer 19. The protruding portion of the first bank 40 may have an inclined side surface, and light emitted from the light emitting element 30 may proceed toward the inclined side surface of the first bank 40. The electrodes 21 and 22 located on the first bank 40 may include a material having high reflectivity, and the light emitted from the light emitting element 30 may be reflected from the electrodes 21 and 22 located on the side surface of the first bank 40 to be emitted in the upward direction of the first planarization layer 19. That is, the first bank 40 may provide a region in which the light emitting elements 30 are located, and may also function as a reflective partition wall that reflects light emitted from the light emitting elements 30 upwardly in a third direction DR3 crossing the first and second directions DR1 and DR2. The side surface of the first bank 40 may be inclined in a linear shape, but is not limited thereto, and the outer surface of the first bank 40 may have a curved semi-circle or semi-ellipse shape. In some embodiments, the first banks 40 may include an organic insulating material such as polyimide (PI), but are not limited thereto.

According to some embodiments, the display device 10 may include a plurality of first patterns 70 located between the first banks 40. The plurality of first patterns 70 may have a thickness that is smaller than that of the first banks 40, and may be spaced apart in the second direction DR2 between the first banks 40. In addition, the first pattern 70 may have a width that is smaller than the distance between the first banks 40 and may be spaced apart from the first banks 40.

As described above, the first banks 40 may form an area therebetween in which the light emitting elements 30 are located. During the manufacturing process of the display device 10, the light emitting elements 30 may be injected onto the electrodes 21 and 22, to be described later, in a state of being dispersed in inks, and may be placed on the electrodes 21 and 22 by an electric field generated on the electrodes 21 and 22. Here, because the first banks 40 located in each sub-pixel PXn have a shape protruding from the top surface of the first planarization layer 19, an area between the first banks 40 and an outer area thereof may be distinguished, and the light emitting elements 30 may be guided to be located between the first banks 40. Similarly, the plurality of first patterns 70 located between the first banks 40 may form steps in an area where the light emitting elements 30 are located between the first banks 40. A portion where the first patterns 70 are located, and a portion between the first patterns 70 spaced apart in the second direction DR2, may be distinguished. The light emitting elements 30 may be guided to be located on the first patterns 70. Therefore, the light emitting elements 30 are located at a relatively high position between the first banks 40, thereby increasing the efficiency in which light emitted from the light emitting elements 30 is reflected from the electrodes 21 and 22.

The plurality of electrodes 21 and 22 are located on the first bank 40 and the first planarization layer 19. The plurality of electrodes 21 and 22 may include a first electrode 21 and a second electrode 22. The first electrode 21 and the second electrode 22 extend in the second direction DR2, and may be located to be spaced apart from each other in the first direction DR1.

The first electrode 21 and the second electrode 22 extend in the second direction DR2 within the sub-pixel PXn, and may be separated from electrodes 21 and 22 of another sub-pixel PXn in the cut area CBA. In some embodiments, the cut area CBA may be located between the first emission areas EMA1 of the sub-pixels PXn adjacent to each other in the second direction DR2, and the first electrode 21 and the second electrode 22 may be separated from other first and second electrodes 21 and 22 located in the sub-pixel PXn adjacent in the second direction DR2 in the cut area CBA. However, the present disclosure is not limited thereto, and some of the electrodes 21 and 22 may be arranged to extend beyond the adjacent sub-pixel PXn in the second direction DR2 without being separated for each sub-pixel PXn, or, for example, only one of the first electrode 21 and the second electrode 22 may be separated.

The first electrode 21 may be electrically connected to the first transistor TR1 through a first contact hole CT1, and the second electrode 22 may be electrically connected to the second voltage line VL2 through a second contact hole CT2. For example, the first electrode 21 may contact the first conductive pattern CDP through the first contact hole CT1 penetrating the first planarization layer 19 at a portion of the second bank 45 extending in the first direction DR1. The second electrode 22 may contact the second voltage line VL2 through the second contact hole CT2 penetrating the first planarization layer 19 at a portion of another second bank 45 extending in the first direction DR1. However, the present disclosure is not limited thereto. In some embodiments, the first contact hole CT1 and the second contact hole CT2 may be located in the first emission area EMA1 surrounded by the second bank 45 so as not to overlap the second bank 45. At least one of the plurality of electrodes 21 and 22 may overlap the first transistor TR1. For example, the first electrode 21 may overlap the first transistor TR1.

Although it is illustrated in the drawing that one first electrode 21 and one second electrode 22 are located for each sub-pixel PXn, the present disclosure is not limited thereto. In some embodiments, a larger number of the first electrodes 21 and the second electrodes 22 may be located for each sub-pixel PXn. In addition, the first electrode 21 and the second electrode 22 located in each sub-pixel PXn may not necessarily have a shape extending in one direction, and the first electrode 21 and the second electrode 22 may be arranged in various structures. For example, the first electrode 21 and the second electrode 22 may have a partially curved or bent shape, and one electrode may be located to surround the other electrode.

The first electrode 21 and the second electrode 22 may be respectively located on the first banks 40. In some embodiments, the first electrode 21 and the second electrode 22 may each be formed to have a width that is larger than that of the first bank 40. For example, each of the first electrode 21 and the second electrode 22 may be located to cover the outer surface of the respective first bank 40. Each of the first electrode 21 and the second electrode 22 may be located on the top and side surfaces of the first bank 40, and the distance between the first electrode 21 and the second electrode 22 may be smaller than the distance between the first banks 40. Further, at least a portion of the first electrode 21 and at least a portion of the second electrode 22 are directly located on the first planarization layer 19, so that they may be, at least partially, located on the same plane.

Each electrode 21, 22 may include a conductive material having high reflectivity. For example, each electrode 21, 22 may include a metal such as silver (Ag), copper (Cu), or aluminum (Al) as a material having high reflectivity, or may be an alloy including aluminum (Al), nickel (Ni), lanthanum (La), and the like. Each electrode 21, 22 may reflect, in the upward direction of each sub-pixel PXn, light emitted from the light emitting element 30 and traveling to the side surface of the first bank 40.

However, the present disclosure is not limited thereto, and each electrode 21, 22 may further include a conductive transparent material. For example, each electrode 21, 22 may include a material such as indium tin oxide (ITO), indium zinc oxide (IZO), and indium tin zinc oxide (ITZO). In some embodiments, each electrode 21, 22 may have a structure in which one or more conductive transparent materials and one or more metal layers having high reflectivity are stacked, or may be formed as a single layer including them. For example, each electrode 21, 22 may have a stacked structure such as ITO/silver (Ag)/ITO, ITO/Ag/IZO, or ITO/Ag/ITZO/IZO.

The plurality of electrodes 21 and 22 may be electrically connected to the light emitting elements 30, and may be applied with a corresponding voltage to allow the light emitting elements 30 to emit light. For example, the plurality of electrodes 21 and 22 may be electrically connected to the light emitting elements 30 through the contact electrodes 26 and 27, respectively, as to be described later. The electrical signals applied to the electrodes 21 and 22 may be transferred to the light emitting elements 30 through the contact electrodes 26 and 27, respectively.

In some embodiments, one of the first electrode 21 and the second electrode 22 may be electrically connected to an anode electrode of the light emitting element 30, and the other one thereof may be electrically connected to a cathode electrode of the light emitting element 30. However, the present disclosure is not limited thereto.

Further, each of the electrodes 21 and 22 may be used to form an electric field in the sub-pixel PXn to align the light emitting elements 30. The light emitting elements 30 may be located between the first electrode 21 and the second electrode 22 by an electric field formed on the first electrode 21 and the second electrode 22. In some embodiments, the light emitting elements 30 of the display device 10 may be injected onto the electrodes 21 and 22 through an inkjet printing process. When inks including the light emitting elements 30 are injected onto the electrodes 21 and 22, an alignment signal is applied to the electrodes 21 and 22 to generate an electric field. The light emitting elements 30 dispersed in the inks may be aligned on the electrodes 21 and 22 by receiving the dielectrophoretic force by the electric field generated on the electrodes 21 and 22.

The second bank 45 may be located on the first planarization layer 19. The second bank 45 may include a portion extending in the first direction DR1 and the second direction DR2 in a plan view to be arranged in a grid pattern over the entire surface of the display area DPA. The second bank 45 may be located across the boundary of each sub-pixel PXn to distinguish neighboring sub-pixels PXn.

In addition, the second bank 45 may be located to surround the first emission area EMA1 and the cut area CBA provided for each sub-pixel PXn to distinguish them. The first electrode 21 and the second electrode 22 may extend in the second direction DR2 to be located across a portion of the second bank 45 extending in the first direction DR1. In a portion of the second bank 45 extending in the second direction DR2, a portion located between the first emission areas EMA1 may have a width that is greater than that of a portion located between the cut areas CBA. Accordingly, the distance between the cut areas CBA may be smaller than the distance between the first emission areas EMA1.

According to some embodiments, the second bank 45 may be formed to have a height that is greater than that of the first bank 40. The second bank 45 may function to reduce or prevent the overflow of inks to adjacent sub-pixels PXn during the inkjet printing process in the manufacturing process of the display device 10. The second bank 45 may separate inks in which different light emitting elements 30 are dispersed for different sub-pixels PXn so as not to be mixed with each other. Similarly to the first bank 40, the second bank 45 may include polyimide (PI), but is not limited thereto.

The light emitting element 30 may be located on the first pattern 70. The plurality of light emitting elements 30 may be located to be spaced apart from each other along the second direction DR2 in which the electrodes 21 and 22 extend, and may be aligned substantially parallel to each other. The distance between the light emitting elements 30 is not particularly limited. In addition, the light emitting element 30 may have a shape extending in one direction, and the extending direction of the light emitting element 30 may be substantially perpendicular to the extending direction in which the electrodes 21 and 22 extend. However, the present disclosure is not limited thereto, and the light emitting element 30 may be located obliquely without being perpendicular to the extending direction of the electrodes 21 and 22.

The light emitting element 30 may include a light emitting layer 36 including a different material to emit light of a different wavelength band to the outside. The display device 10 may include the light emitting elements 30 that emit light of different wavelength bands. Accordingly, light of the first color, light of the second color, and light of the third color may be emitted from the first sub-pixel PX1, the second sub-pixel PX2, and the third sub-pixel PX3, respectively. However, the present disclosure is not limited thereto. In some cases, each of the sub-pixels PXn may include the light emitting element 30 of the same type to emit light of substantially the same color.

Between the first banks 40, the light emitting element 30 may have both ends respectively located above the electrodes 21 and 22. For example, the light emitting element 30 may be located such that one end is placed above the first electrode 21, and such that the other end is placed above the second electrode 22. The extending length of the light emitting element 30 may be longer than the distance between the first electrode 21 and the second electrode 22, and both ends of the light emitting element 30 may be respectively located above the first electrode 21 and the second electrode 22.

Further, in some embodiments, the light emitting elements 30 may be located on the first patterns 70. The light emitting elements 30 may be located at a high position on the first pattern 70, and may be electrically connected to the first electrode 21 and the second electrode 22. However, the present disclosure is not limited thereto, and the light emitting elements 30 need not be located on the first pattern 70 according to the arrangement and shape of the first pattern 70.

The light emitting element 30 may be provided with a plurality of layers arranged in a direction that is perpendicular to the top surface of the first substrate 11 or the first planarization layer 19 (e.g., the third direction DR3). The light emitting element 30 of the display device 10 may be located such that one extending direction is parallel to the first planarization layer 19, and the plurality of semiconductor layers included in the light emitting element 30 may be sequentially arranged along a direction(s) parallel to the top surface of the first planarization layer 19 (e.g., the first and second directions DR1 and DR2). However, the present disclosure is not limited thereto. In some cases, when the light emitting element 30 has a different structure, a plurality of layers may be arranged in a direction perpendicular to the first planarization layer 19.

Figure 6:
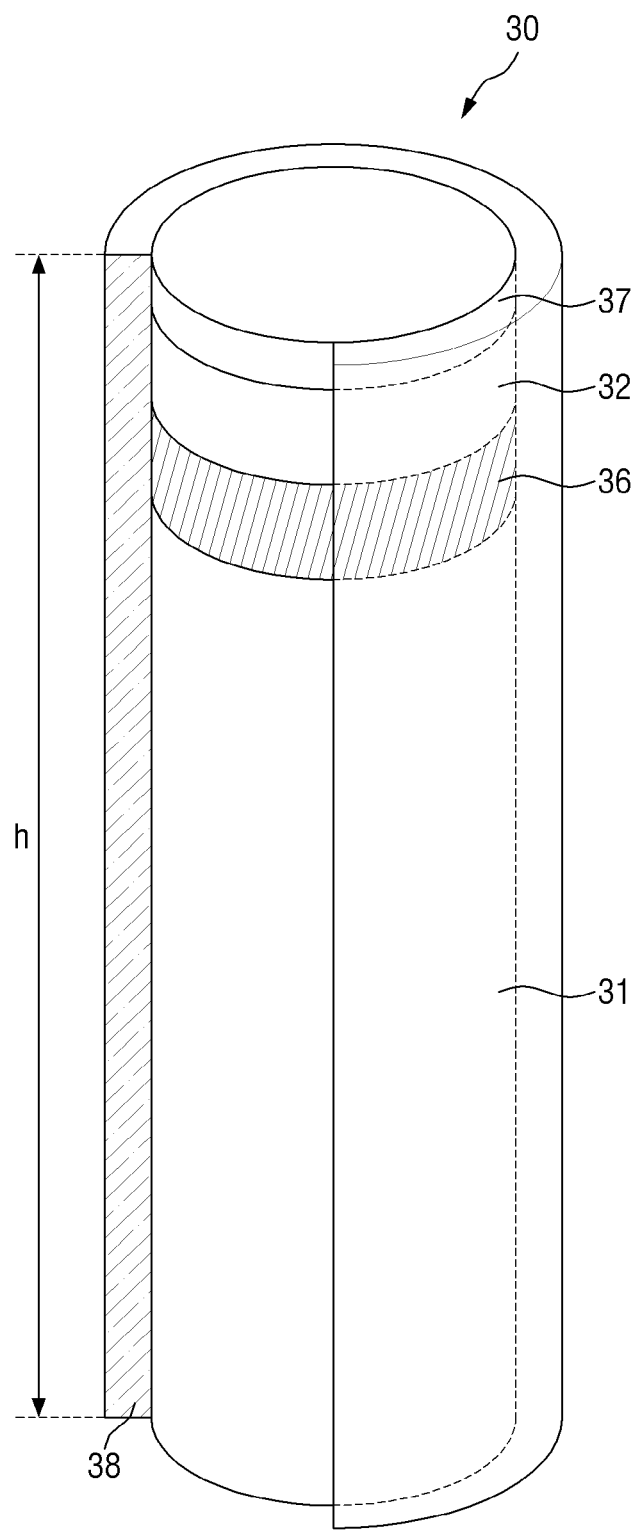
FIG. 6 is a perspective view showing a light emitting element according to some embodiments.
Figure 7:
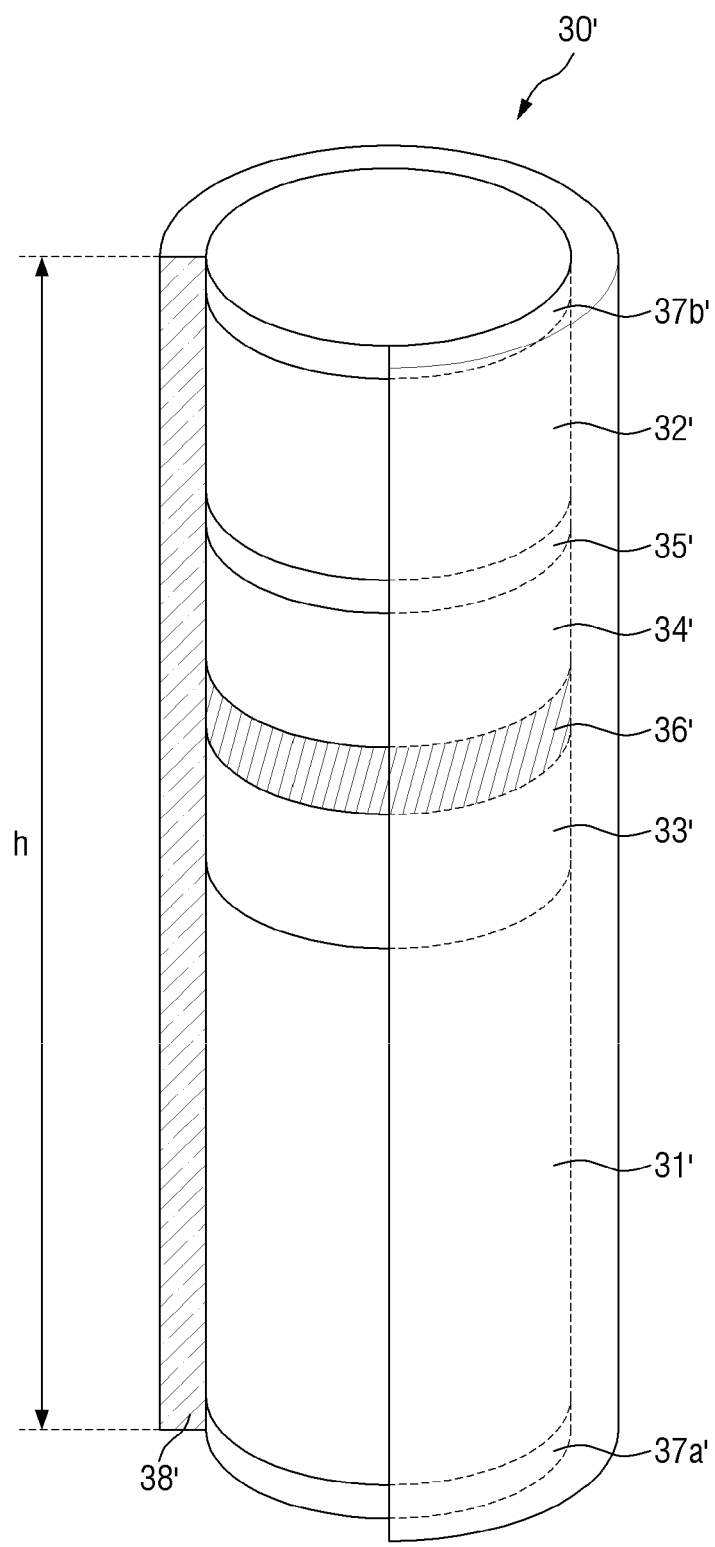
FIG. 7 is a perspective view showing a light emitting element according to other embodiments.

FIG. 6 is a perspective view showing a light emitting element according to some embodiments, and FIG. 7 is a perspective view showing a light emitting element according to other embodiments.

Referring to FIG. 6, the light emitting element 30 may be a light emitting diode. For example, the light emitting element 30 may be an inorganic light emitting diode that has a micrometer or nanometer size, and that is made of an inorganic material. The inorganic light emitting diode may be aligned between two electrodes (21 and 22 in FIG. 5) whose polarities are formed when an electric field is formed in a corresponding direction between the two electrodes (21 and 22 in FIG. 5) opposing each other. The light emitting element 30 may be aligned between the two electrodes (21 and 22 in FIG. 5) by the electric field formed on the two electrodes (21 and 22 in FIG. 5).

The light emitting element 30 according to some embodiments may have a shape extending in one direction. The light emitting element 30 may have a shape of a cylinder, a rod, a wire, a tube, or the like. However, the shape of the light emitting element 30 is not limited thereto, and the light emitting element 30 may have a polygonal prism shape such as a regular cube, a rectangular parallelepiped, or a hexagonal prism, or may have various shapes such as a shape extending in one direction and having an outer surface partially inclined. A plurality of semiconductors included in the light emitting element 30 to be described later may have a structure in which they are sequentially arranged or stacked along the one direction.

The light emitting element 30 may include a semiconductor layer doped with any conductivity type (e.g., p-type or n-type) impurities. The semiconductor layer may emit light of a corresponding wavelength band by receiving an electrical signal applied from an external power supply.

As illustrated in FIG. 6, the light emitting element 30 may include a first semiconductor layer 31, a second semiconductor layer 32, a light emitting layer 36, an electrode layer 37, and an insulating film 38.

The first semiconductor layer 31 may be an n-type semiconductor. When the light emitting element 30 emits light of a blue wavelength band, the first semiconductor layer 31 may include a semiconductor material having a composition ratio of $Al_xGa_yIn_{(1-x-y)}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The first semiconductor layer 31 may be doped with an n-type dopant, and the n-type dopant may be Si, Ge, Sn, or the like. For example, the first semiconductor layer 31 may be n-GaN doped with n-type Si. The length of the first semiconductor layer 31 may have a range of about 1.5 µm to about 5 µm, but is not limited thereto.

The second semiconductor layer 32 is located on the light emitting layer 36 to be described later. The second semiconductor layer 32 may be a p-type semiconductor. When the light emitting element 30 emits light of a blue or green wavelength band, the second semiconductor layer 32 may include a semiconductor material having a composition ratio of $Al_xGa_yIn_{(1-x-y)}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. The length of the second semiconductor layer 32 may have a range of about 0.05 µm to about 0.10 µm, but is not limited thereto.

Meanwhile, although it is illustrated in the drawing that the first semiconductor layer 31 and the second semiconductor layer 32 are each configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is located between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. When the light emitting layer 36 emits light of a blue wavelength band, a material such as AlGaN or AlGaInN may be included. For example, when the light emitting layer 36 has a structure in which quantum layers and well layers are alternately stacked in a multiple quantum well structure, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band of about 450 nm to about 495 nm.

However, the present disclosure is not limited thereto, and the light emitting layer 36 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 36 is not limited to light of a blue wavelength band, but the light emitting layer 36 may also emit light of a red or green wavelength band in some cases. The length of the light emitting layer 36 may have a range of about 0.05 µm to about 0.10 µm, but is not limited thereto.

Meanwhile, light emitted from the light emitting layer 36 may be emitted to both side surfaces as well as the outer surface of the light emitting element 30 in a longitudinal direction. The directionality of light emitted from the light emitting layer 36 is not limited to one direction.

Referring to FIG. 7, a light emitting element 30' according to other embodiments may further include a third semiconductor layer 33' located between a first semiconductor layer 31' and a light emitting layer 36', and may further include a fourth semiconductor layer 34' and a fifth semiconductor layer 35' located between the light emitting layer 36' and a second semiconductor layer 32'. The light emitting element 30' of FIG. 7 is different from that of the example shown in FIG. 6 in that a plurality of semiconductor layers 33', 34', and 35' and electrode layers 37a' and 37b' are further arranged, and the light emitting layer 36' contains different elements. In the following description, a repeated description will be omitted, and differences between different embodiments will be mainly described.

In the light emitting element 30 of FIG. 6, the light emitting layer 36 may include nitrogen (N) to emit blue or green light. In contrast, in the light emitting element 30' of FIG. 7, the light emitting layer 36' and other semiconductor layers may each be a semiconductor including at least phosphorus (P). The light emitting element 30' according to some embodiments may emit red light having a central wavelength band in a range of about 620 nm to about 750 nm. However, it should be understood that the central wavelength band of red light is not limited to the above-mentioned range, and includes all wavelength ranges that can be recognized as red in the art.

For example, the first semiconductor layer 31' may be an n-type semiconductor layer and may include a semiconductor material having a composition ratio of $In_xAl_yGa(1-x-y)P$ ($0 \leq x \leq 1$, $0 \leq y \leq 1$, $0 \leq x+y \leq 1$). The first semiconductor layer 31' may be any one or more of InAlGaP, GaP, AlGaP, InGaP, AlP, and InP doped with n-type. For example, the first semiconductor layer 31' may be n-AlGaInP doped with n-type Si.

The second semiconductor layer 32' may be a p-type semiconductor layer, and may include a semiconductor material having a composition ratio of $In_xAl_yGa(1-x-y)P$ ($0 \leq x \leq 1$, $0 \leq y \leq 1$, $0 \leq x+y \leq 1$). The second semiconductor layer 32' may be any one or more of InAlGaP, GaP, AlGaNP, InGaP, AlP, and InP doped with p-type. For example, the second semiconductor layer 32' may be p-GaP doped with p-type Mg.

The light emitting layer 36' may be located between the first semiconductor layer 31' and the second semiconductor layer 32'. The light emitting layer 36' may emit light of a corresponding wavelength band by including a material having a single or multiple quantum well structure. When the light emitting layer 36' has a structure in which quantum layers and well layers are alternately stacked in a multiple quantum well structure, the quantum layer may include a material such as AlGaP or AlInGaP, and the well layer may include a material such as GaP or AlInP. For example, the light emitting layer 36' may include AlGaInP as a quantum layer and AlInP as a well layer to emit red light having a central wavelength band of about 620 nm to about 750 nm.

The light emitting element 30' of FIG. 7 may include a cladding layer adjacent to the light emitting layer 36'. As shown in the drawing, below and above the light emitting layer 36', the third semiconductor layer 33' and the fourth semiconductor layer 34' located between the first semiconductor layer 31' and the second semiconductor layer 32' may be cladding layers.

The third semiconductor layer 33' may be located between the first semiconductor layer 31' and the light emitting layer 36'. Similarly to the first semiconductor layer 31', the third semiconductor layer 33' may be an n-type semiconductor, and may include a semiconductor material having a composition ratio of $In_xAl_yGa(1-x-y)P$ ($0 \leq x \leq 1$, $0 \leq y \leq 1$, $0 \leq x+y \leq 1$). For example, the first semiconductor layer 31' may be n-AlGaInP, and the third semiconductor layer 33' may be n-AlInP. However, the present disclosure is not limited thereto.

The fourth semiconductor layer 34' may be located between the light emitting layer 36' and the second semiconductor layer 32'. Similarly to the second semiconductor layer 32', the fourth semiconductor layer 34' may be an p-type semiconductor, and may include a semiconductor material having a composition ratio of $In_xAl_yGa(1-x-y)P$ ($0 \leq x \leq 1$, $0 \leq y \leq 1$, $0 \leq x+y \leq 1$). For example, the second semiconductor layer 32' may be p-GaP, and the fourth semiconductor layer 34' may be p-AlInP.

The fifth semiconductor layer 35' may be located between the fourth semiconductor layer 34' and the second semiconductor layer 32'. The fifth semiconductor layer 35' may be a p-type doped semiconductor, similarly to the second semiconductor layer 32' and the fourth semiconductor layer 34'. In some embodiments, the fifth semiconductor layer 35' may function to reduce a difference in lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include p-GaInP, p-AlInP, p-AlGaInP, or the like, but is not limited thereto. In addition, the third semiconductor layer 33', the fourth semiconductor layer 34', and the fifth semiconductor layer 35' may have lengths in a range of about 0.08 μm to about 0.25 μm, but are not limited thereto.

The first electrode layer 37a' and the second electrode layer 37b' may be located on the first semiconductor layer 31' and the second semiconductor layer 32', respectively. The first electrode layer 37a' may be located on the bottom surface of the first semiconductor layer 31', and the second electrode layer 37b' may be located on the top surface of the second semiconductor layer 32'. However, the present disclosure is not limited thereto, and at least one of the first electrode layer 37a' and the second electrode layer 37b' may be omitted. For example, in the light emitting element 30', the first electrode layer 37a' may be omitted from the bottom surface of the first semiconductor layer 31', and instead there may be only one second electrode layer 37b', which is provided on the top surface of the second semiconductor layer 32'.

Meanwhile, referring to FIG. 6 again, the electrode layer 37 may be an ohmic contact electrode. However, the present disclosure is not limited thereto, and the electrode layer 37 may be a Schottky contact electrode. The light emitting element 30 may include at least one electrode layer 37. Although FIG. 6 illustrates that the light emitting element 30 includes one electrode layer 37, the present disclosure is not limited thereto. In some cases, the light emitting element 30 may include a larger number of electrode layers 37, or may be omitted. The following description of the light emitting element 30 may be equally applied even if the number of electrode layers 37 is different or further includes other structures.

In the display device 10 according to some embodiments, when the light emitting element 30 is electrically connected to an electrode or a contact electrode, the electrode layer 37 may reduce the resistance between the light emitting element 30 and the electrode or contact electrode. The electrode layer 37 may include conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 37 may include an n-type or p-type doped semiconductor material. The electrode layer 37 may include the same material or different materials, but is not limited thereto.

The insulating film 38 is located to surround the outer surfaces of the plurality of semiconductor layers and electrode layers described above. For example, the insulating film 38 may be located to surround at least the outer surface of the light emitting layer 36, and may extend in one direction in which the light emitting element 30 extends. The insulating film 38 may function to protect the members. The insulating film 38 may be formed to surround side surfaces of the members to expose both ends of the light emitting element 30 in the longitudinal direction.

Although it is illustrated in the drawing that the insulating film 38 extends in the longitudinal direction of the light emitting element 30 to cover a region from the first semiconductor layer 31 to the side surface of the electrode layer 37, the present disclosure is not limited thereto. The insulating film 38 may cover only the outer surfaces of some semiconductor layers, such as the light emitting layer 36, or may cover only a portion of the outer surface of the electrode layer 37 to partially expose the outer surface of each electrode layer 37. Further, in cross-sectional view, the insulating film 38 may have a top surface, which is rounded in a region adjacent to at least one end of the light emitting element 30.

The thickness of the insulating film 38 may have a range of about 10 nm to about 1.0 µm, but is not limited thereto. For example, the thickness of the insulating film 38 may be around 40 nm.

The insulating film 38 may include materials having insulating properties, for example, at least one selected from silicon oxide (SiOx), silicon nitride (SiNx), silicon oxynitride (SiOxNy), aluminum nitride (AlN), and aluminum oxide (A2O3), and may be formed as a single layer or as multiple layers containing any one thereof. Accordingly, it is possible to reduce or prevent the likelihood of an electrical short circuit that otherwise may occur when the light emitting layer 36 is in direct contact with the electrode through which the electrical signal is transmitted to the light emitting element 30. In addition, because the insulating film 38 protects the outer surface of the light emitting element 30 including the light emitting layer 36, it is possible to reduce or prevent a decrease in light emission efficiency.

Further, the insulating film 38 may have an outer surface that is surface-treated. The light emitting elements 30 may be injected onto the electrode in a state of being dispersed in a predetermined ink to then be aligned. Here, the surface of the insulating film 38 may be treated in a hydrophobic or hydrophilic manner to keep the light emitting elements 30 in a dispersed state without aggregation with other light emitting elements 30 adjacent each other in the ink. For example, the outer surface of the insulating film 38 may be surface-treated with a material such as stearic acid, or 2,3-naphthalene dicarboxylic acid.

The light emitting element 30 may have a length h of about 1 µm to about 10 µm or about 2 µm to about 6 µm, and, for example, about 3 µm to about 5 µm. Further, a diameter of the light emitting element 30 may have a range of about 30 nm to about 700 nm, and an aspect ratio of the light emitting element 30 may be about 1.2 to about 100. However, the present disclosure is not limited thereto, and the plurality of light emitting elements 30 included in the display device 10 may have different diameters according to a difference in composition of the light emitting layer 36. For example, the diameter of the light emitting element 30 may be in a range of about 500 nm.

Meanwhile, the shape and material of the light emitting element 30 are not limited to those of FIGS. 6 and 7. In some embodiments, the light emitting element 30 may include a larger number of layers, or may have a different shape.

Referring back to FIGS. 4 and 5, both ends of the light emitting element 30 may be in contact with the contact electrodes 26 and 27, respectively. According to some embodiments, because the light emitting element 30 does not have the insulating film (38 in FIG. 6) formed on one end surface in the extending direction, and because a portion of the semiconductor layer or a portion of the electrode layer is exposed, the exposed semiconductor layer may be in contact with the contact electrodes 26 and 27. However, the present disclosure is not limited thereto. In some cases, in the light emitting element 30, at least a portion of the insulating film (38 in FIG. 6) is removed, and the insulating layer (38 in FIG. 6) is removed, so that the side surfaces at both ends of the semiconductor layers may be partially exposed. The side surfaces of the exposed semiconductor layer may be in direct contact with the contact electrodes 26 and 27.

The first insulating layer 51 may be partially located on the light emitting element 30. For example, the first insulating layer 51 is located to partially surround the outer surface of the light emitting element 30 so as not to cover both ends of the light emitting element 30. The contact electrodes 26 and 27 to be described later may be in contact with both ends of the light emitting element 30 that are not covered by the first insulating layer 51. A portion of the first insulating layer 51 located on the light emitting element 30 may extend in the second direction DR2 in a plan view to form a linear or island-like pattern in each sub-pixel PXn. The first insulating layer 51 may protect the light emitting element 30 while fixing the light emitting element 30 during the manufacturing process of the display device 10.

The plurality of contact electrodes 26 and 27 may be located on the first insulating layer 51. The plurality of contact electrodes 26 and 27 may have a shape extending in one direction. A first contact electrode 26 and a second contact electrode 27 of the contact electrodes 26 and 27 may be located on a portion of the first electrode 21 and a portion of the second electrode 22, respectively. The first contact electrode 26 is located on the first electrode 21, and the second contact electrode 27 is located on the second electrode 22. The first contact electrode 26 and the second contact electrode 27 may each have a shape extending in the second direction DR2. The first contact electrode 26 and the second contact electrode 27 may be located opposite to each other with a space therebetween in the first direction DR1, and they may form striped patterns in the first emission area EMA1 of each sub-pixel PXn.

In some embodiments, the widths of the first contact electrode 26 and the second contact electrode 27 measured in one direction may be equal to or smaller than the widths of the first electrode 21 and the second electrode 22 measured in the one direction, respectively. The first contact electrode 26 and the second contact electrode 27 may be located not only to contact one end and the other end of the light emitting element 30, respectively, but also to cover a portion of the top surface of the first electrode 21 and a portion of the top surface of the second electrode 22, respectively.

The plurality of contact electrodes 26 and 27 may be in contact with the light emitting element 30 and the electrodes 21 and 22. The semiconductor layers (31 and 32 in FIG. 6) may be exposed on both end surfaces of the extending direction of the light emitting element 30, and the first contact electrode 26 and the second contact electrode 27 may be in contact with the end surfaces of the light emitting element 30 exposing the semiconductor layers (31 and 32 in FIG. 6). One end of the light emitting element 30 may be electrically connected to the first electrode 21 through the first contact electrode 26, and the other end thereof may be electrically connected to the second electrode 22 through the second contact electrode 27.

Although one first contact electrode 26 and one second contact electrode 27 are located in one sub-pixel PXn in the drawing, the present disclosure is not limited thereto. The number of the first contact electrodes 26 and the second contact electrodes 27 may vary depending on the number of the first electrodes 21 and the second electrodes 22 located in each sub-pixel PXn.

As shown in FIG. 5, a second insulating layer 52 may be located on the first contact electrode 26. The second insulating layer 52 may electrically insulate the first contact electrode 26 and the second contact electrode 27 from each other. The second insulating layer 52 may be located to cover the first contact electrode 26, but might not be located on the other end of the light emitting element 30 such that the light emitting element 30 can be brought into contact with the second contact electrode 27. The second insulating layer 52 may partially contact the first contact electrode 26, as well as the first insulating layer 51, at the top surface of the first insulating layer 51. The side surface of the second insulating layer 52 in a direction in which the second electrode 22 is located may be aligned with one side surface of the first insulating layer 51.

The second contact electrode 27 may be located on the second electrode 22, on the first insulating layer 51, and on the second insulating layer 52. The second contact electrode 27 may contact the other end of the light emitting element 30 and the exposed top surface of the second electrode 22. The other end of the light emitting element 30 may be electrically connected to the second electrode 22 through the second contact electrode 27.

The second contact electrode 27 may partially contact the first pattern 70, the first insulating layer 51, the second insulating layer 52, the second electrode 22, and the light emitting element 30. The first contact electrode 26 and the second contact electrode 27 might not contact each other due to the configuration of the first insulating layer 51 and the second insulating layer 52. However, the present disclosure is not limited thereto, and in some cases, the second insulating layer 52 may be omitted.

The contact electrodes 26 and 27 may include a conductive material. For example, they may include ITO, IZO, ITZO, aluminum (Al), or the like. As an example, the contact electrodes 26 and 27 may include a transparent conductive material, and light emitted from the light emitting element 30 may pass through the contact electrodes 26 and 27 and proceed toward the electrodes 21 and 22. However, the present disclosure is not limited thereto.

The third insulating layer 53 may be located entirely on the first substrate 11 (e.g., over an entirety of the first substrate 11). The third insulating layer 53 may function to protect the members located on the first substrate 11 against the external environment.

Each of the first insulating layer 51, the second insulating layer 52, and the third insulating layer 53 described above may include an inorganic insulating material or an organic insulating material. In some embodiments, the first insulating layer 51, the second insulating layer 52, and the third insulating layer 53 may include an inorganic insulating material such as silicon oxide (SiOx), silicon nitride (SiNx), silicon oxynitride (SiOxNy), aluminum oxide ($Al_2O_3$), aluminum nitride (AlN), and the like. Alternatively, the first insulating layer 51, the second insulating layer 52, and the third insulating layer 53 may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like. However, the present disclosure is not limited thereto.

Figure 8:
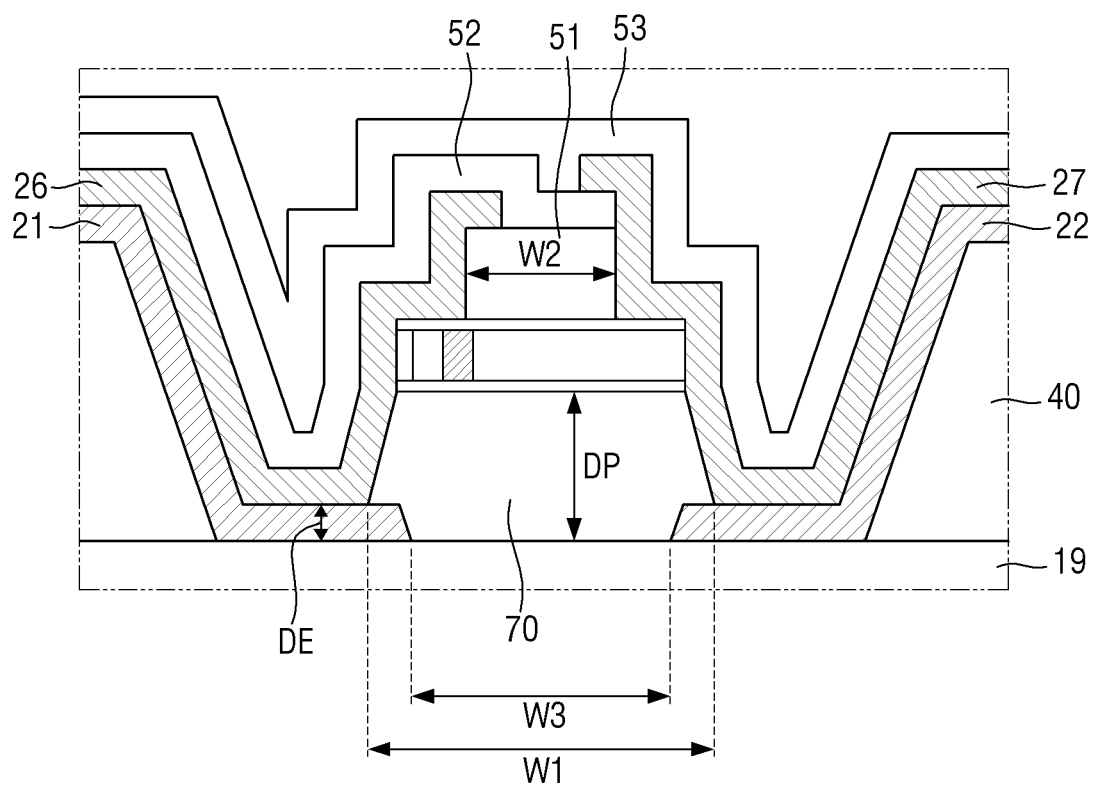
FIG. 8 is an enlarged cross-sectional view of a portion of FIG. 5.

FIG. 8 is an enlarged cross-sectional view of a portion of FIG. 5.

Referring to FIG. 8 together with FIG. 4, the first patterns 70 are located to be spaced apart from each other in the second direction DR2 between the first banks 40. The first patterns 70 may be formed to protrude from the top surface of the first planarization layer 19 to distinguish relevant positions between the first banks 40.

The first pattern 70 according to some embodiments may allow the light emitting elements 30 to be located at a relatively high position in the first emission area EMA1 of each sub-pixel PXn. Accordingly, the efficiency in which light emitted from the light emitting elements 30 is reflected from the electrodes 21 and 22 is improved, thereby increasing the light emission efficiency.

According to some embodiments, the light emitting element 30 may be located to overlap the first pattern 70 in the thickness direction. The light emitting element 30 may be located on the first pattern 70 to be positioned high. From the top surface of the first substrate 11 or the first planarization layer 19, the height of the light emitting element 30 located on the first pattern 70 may be higher than the height of the light emitting element 30 if it was located in a region having no first pattern 70. The height at which the light emitting element 30 is located may be adjusted by adjusting the thickness of the first pattern 70, and the reflection efficiency of the light emitting element 30 may be adjusted by adjusting the thickness of the first pattern 70.

For example, the first pattern 70 may have a predetermined thickness. According to some embodiments, a thickness DP of the first pattern 70 may be greater than a thickness DE of the electrodes 21 and 22. Further, in some embodiments, a width W1 of the first pattern 70 may be greater than a distance W3 between the first electrode 21 and the second electrode 22, and the first pattern 70 may be located to cover both one end of the first electrode 21 and one end of the second electrode 22. Furthermore, the width W1 of the first pattern 70 may be greater than a width W2 of the first insulating layer 51

However, the width W1 and the thickness DP of the first pattern 70 are not limited to the above, and the width W1 of the first pattern 70 may be equal to or less than the distance W3 between the electrodes 21 and 22.

Meanwhile, the display device 10 may be suitably monitored, to check whether the light emitting element 30 has been formed as designed, by measuring characteristics such as height, alignment degree, and luminance of the light emitting element 30 located in the sub-pixel PXn.

The height and alignment degree of the light emitting element 30 may be measured through a reflected image of an object. For example, an optical device such as an ellipsometer may be used. However, in the sub-pixels PXn of the display area DPA, complex circuits (e.g., a plurality of transistors, a capacitor, and a plurality of signal lines) are arranged below the light emitting elements 30 so that it may be difficult to measure the height of the light emitting element 30.

The display device according to some embodiments may include a dummy sub-pixel to accurately monitor the height, alignment degree, and luminance of the light emitting elements 30 located in the sub-pixels PXn of the display area DPA.

Figure 9:
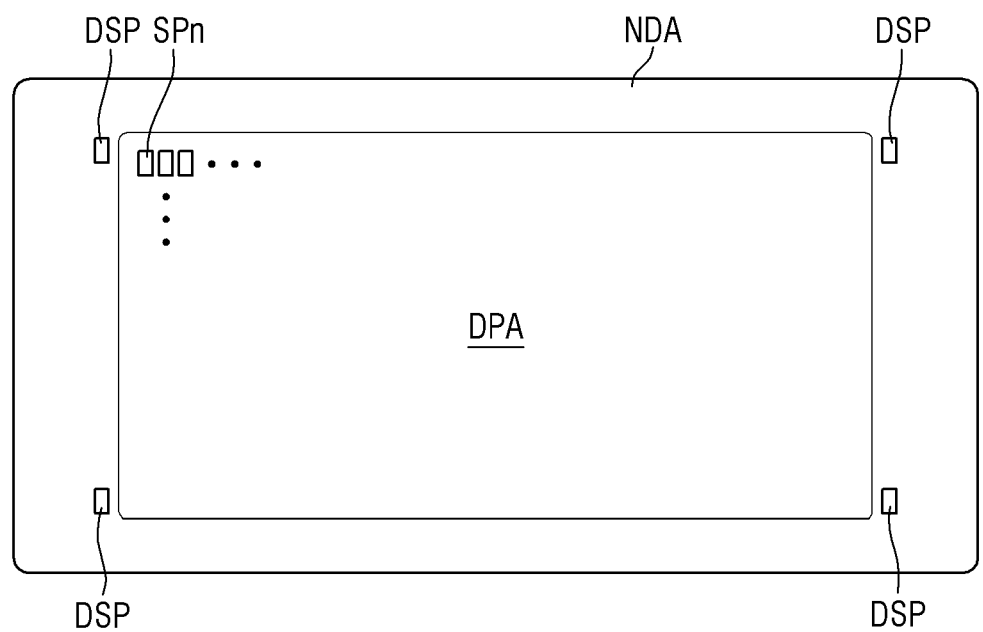
FIG. 9 is a plan view schematically illustrating a display device according to some embodiments.
Figure 10:
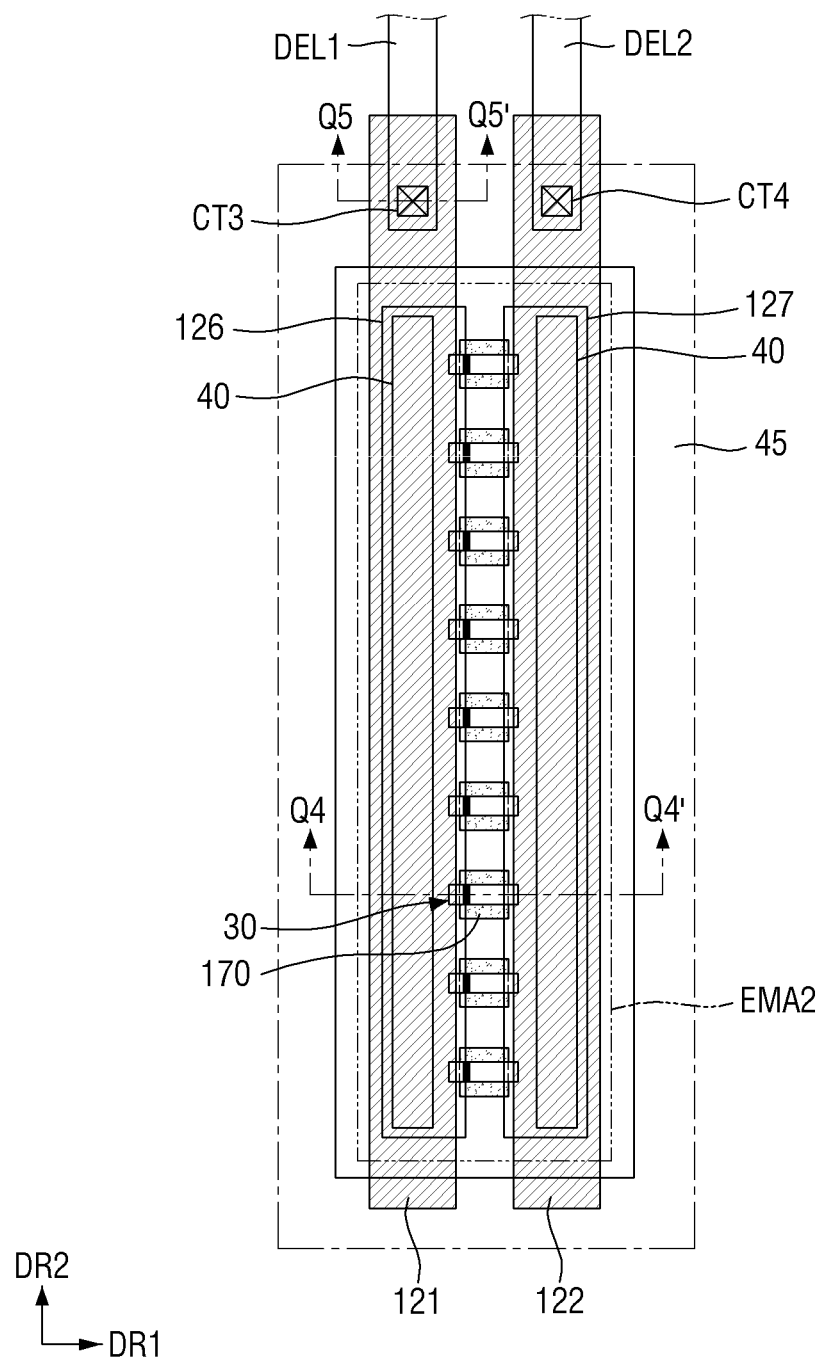
FIG. 10 is a plan view schematically illustrating a dummy sub-pixel of a display device according to some embodiments.
Figure 11:
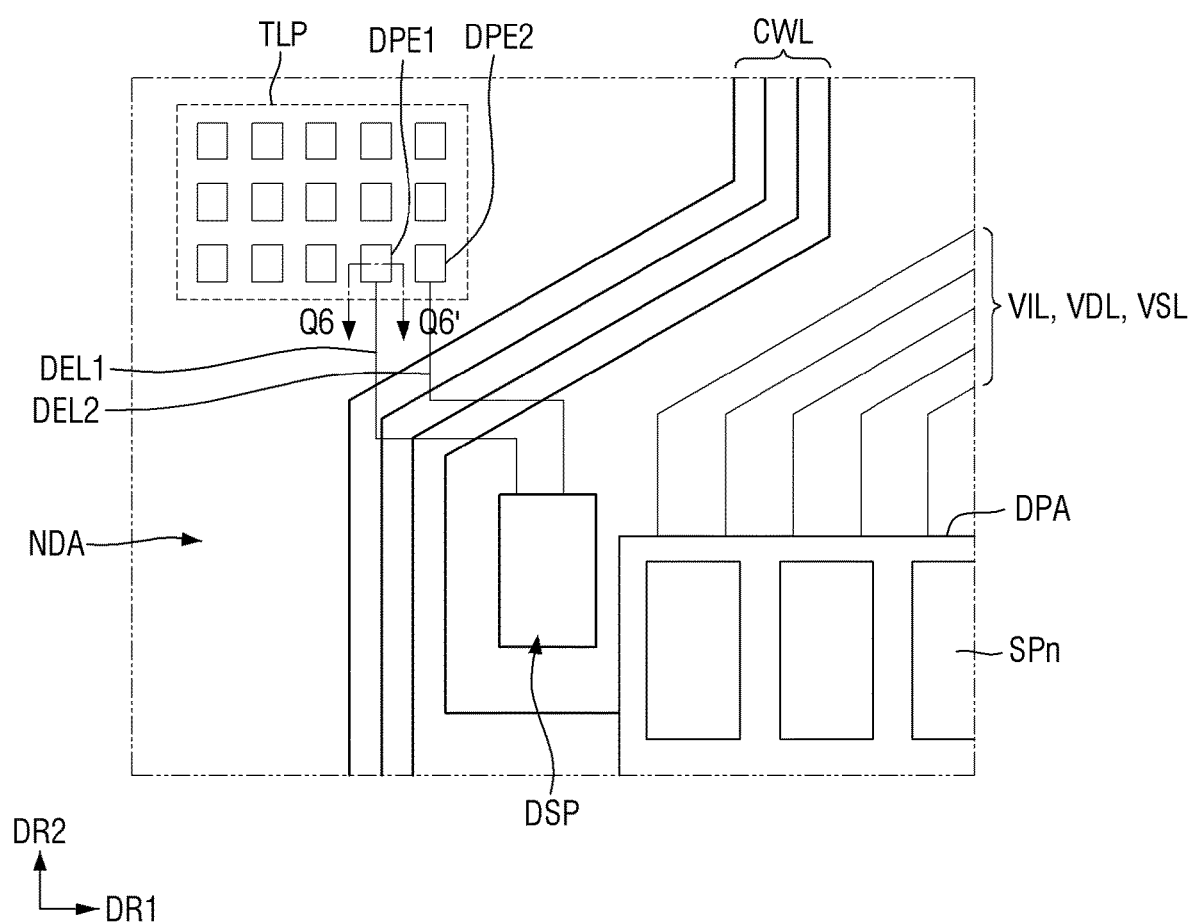
FIG. 11 is an enlarged plan view of a portion of a display device according to some embodiments.
Figure 12:
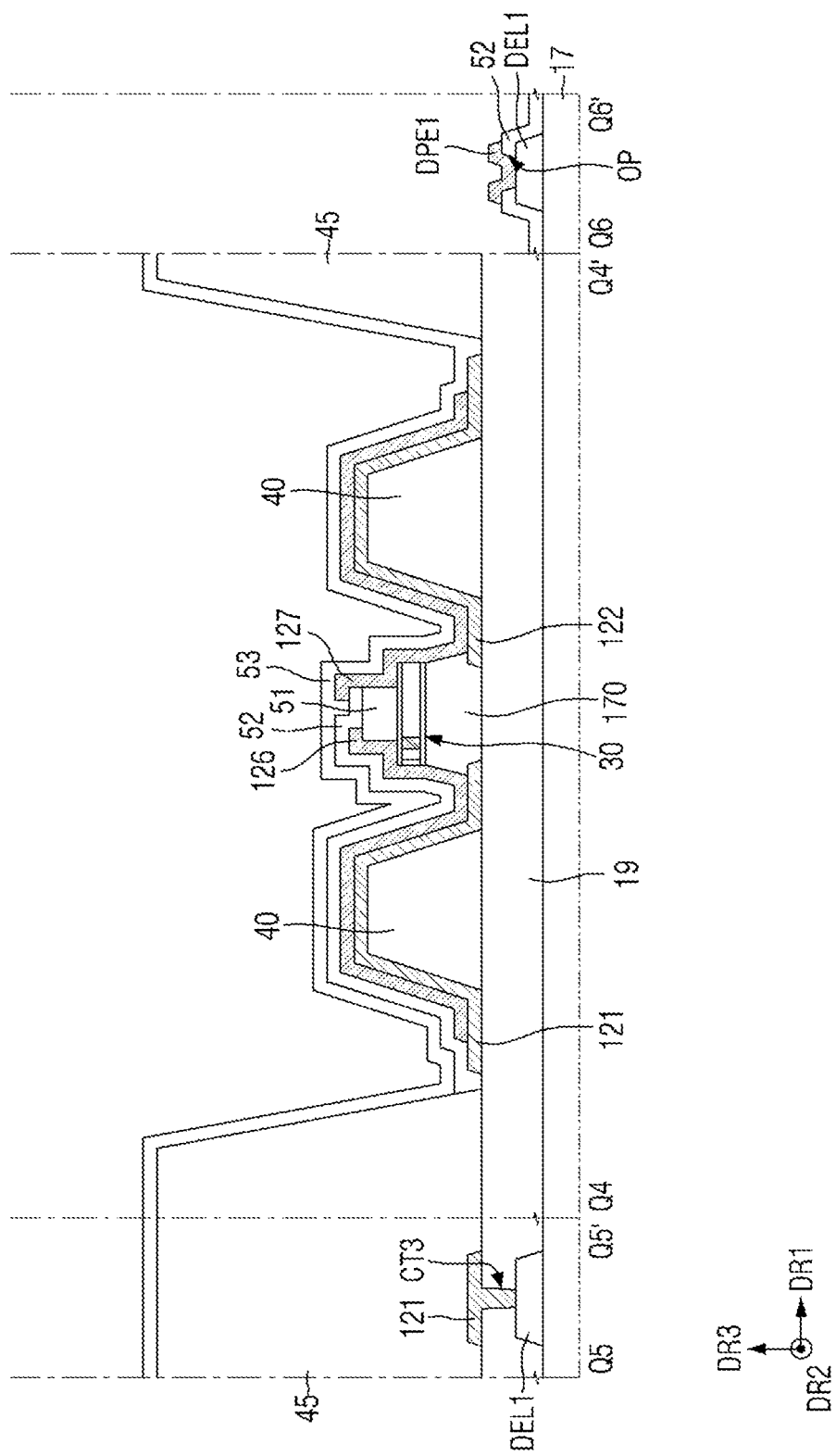
FIG. 12 is a cross-sectional view taken along the lines Q4-Q4' and Q5-Q5' of FIG. 10, and along the line Q6-Q6' of FIG. 11.
Figure 13:
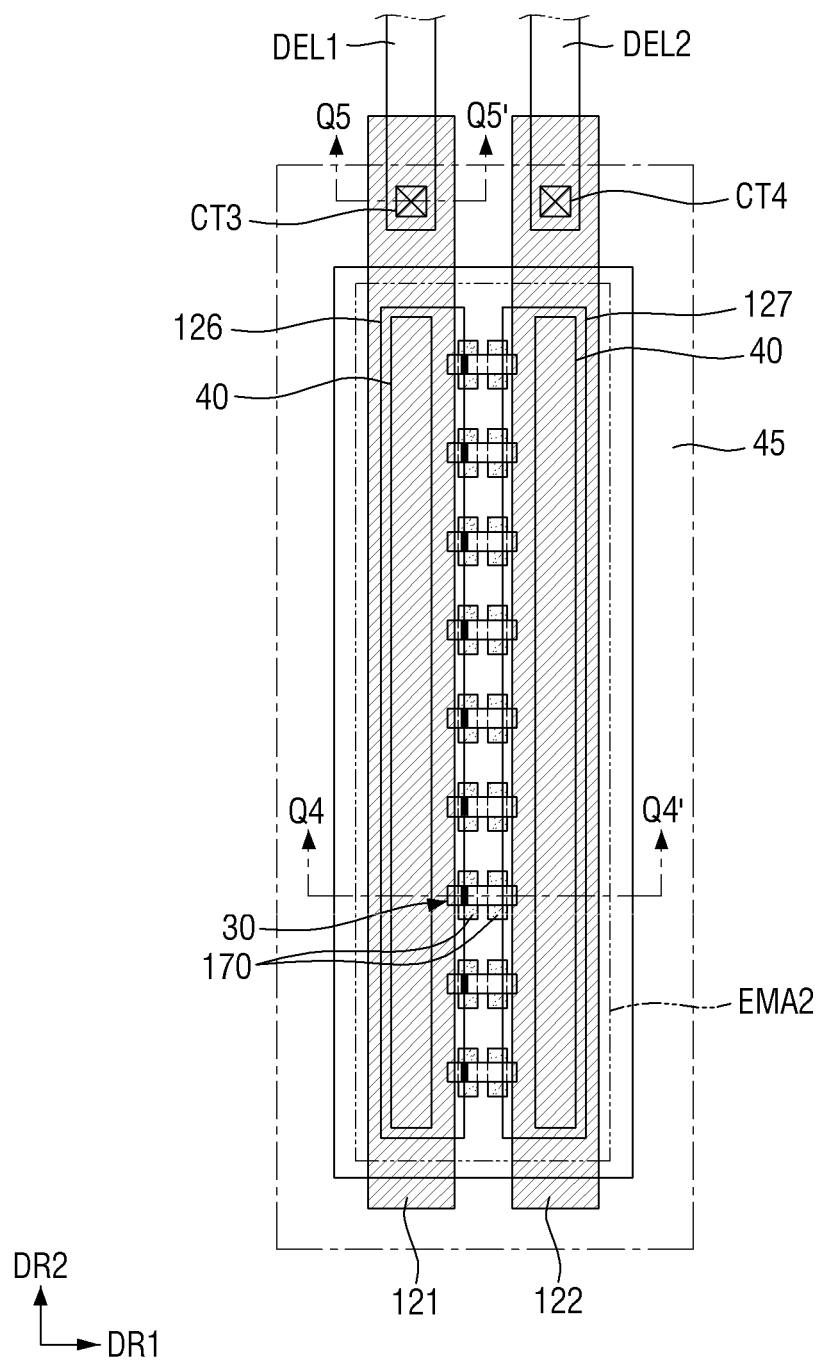
FIG. 13 is a plan view schematically illustrating a dummy sub-pixel of a display device according to some embodiments.

FIG. 9 is a plan view schematically illustrating a display device according to some embodiments, FIG. 10 is a plan view schematically illustrating a dummy sub-pixel of a display device according to some embodiments, FIG. 11 is an enlarged plan view of a portion of a display device according to some embodiments, FIG. 12 is a cross-sectional view taken along the lines Q4-Q4' and Q5-Q5' of FIG. 10, and along the line Q6-Q6' of FIG. 11, and FIG. 13 is a plan view schematically illustrating a dummy sub-pixel of a display device according to some embodiments.

Referring to FIG. 9, the display device 10 according to some embodiments may include the display area DPA and the non-display area NDA. A plurality of sub-pixels SPn may be located in the display area DPA to display a screen, and at least one dummy sub-pixel DSP may be located in the non-display area NDA.

One or more dummy sub-pixels DSP may be located in the non-display area NDA. The dummy sub-pixel DSP may be adjacent to at least one of four corners of the non-display area NDA. The dummy sub-pixel DSP may be located as close as possible to, or as close as suitable to, the display area DPA so as to be formed substantially the same as the sub-pixel SPn located in the display area DPA. In some embodiments, the dummy sub-pixels DSP may be adjacent to the four corners of the display area DPA, and may be formed substantially the same as the sub-pixels SPn located in the display area DPA. Accordingly, a process of observing the dummy sub-pixel DSP may replace a process of observing the sub-pixels SPn of the display area DPA.

Referring to FIG. 10, the dummy sub-pixel DSP may include a second emission area EMA2 and a non-emission area. In the second emission area EMA2, the light emitting element 30 is located to emit light of a corresponding wavelength band. The light emitting element 30 may be omitted in the non-emission area, and light emitted from the light emitting element 30 does not reach, so that no light is emitted from the non-emission area. The emission area may include an area in which the light emitting element 30 is located, and an area adjacent to the light emitting element 30 to emit lights emitted from the light emitting element 30. The present disclosure is not limited thereto, and, in other embodiments, the emission area may also include an area in which light emitted from the light emitting element 30 is reflected or refracted by another member and emitted. The plurality of light emitting elements 30 may be located in the dummy sub-pixel DSP, and the emission area may be formed to include an area where the light emitting elements 30 are located and are an area adjacent thereto. The second bank 45 may be located around the second emission area EMA2.

A plurality of dummy electrodes 121 and 122 for aligning the light emitting element 30 may be located in the dummy sub-pixel DSP. The plurality of dummy electrodes 121 and 122 may be located to be spaced apart from each other in the first direction DR1, and may extend in the second direction DR2. The dummy electrodes 121 and 122 may include a first dummy electrode 121 and a second dummy electrode 122.

The first dummy electrode 121 may be connected to a first dummy line DEL1 through a third contact hole CT3, and the second dummy electrode 122 may be connected to a second dummy line DEL2 through a fourth contact hole CT4. The first dummy line DEL1 and the second dummy line DEL2 may be connected to a lighting pad portion TLP (see FIG. 11) located in the non-display area NDA to receive a current from the outside, and to transfer the current to the first dummy electrode 121 and the second dummy electrode 122.

Referring to FIG. 11, a plurality of signal lines extending from the display area DPA may be located in the non-display area NDA of the display device 10, according to some embodiments. For example, the initialization voltage line VIL, the first voltage line VDL, and the second voltage line VSL extending from the sub-pixels SPn may be located above the display area DPA. In addition, signal connection lines CWL extending from the scan driver (SDR in FIG. 2) may be located on the left of the display area DPA. In some embodiments, the dummy pixel DSP may be located in the non-display area NDA between the signal connection line CWL and the display area DPA. The dummy pixel DSP may be located to not overlap the signal connection line CWL.

The lighting pad portion TLP may be located in the non-display area NDA. The lighting pad portion TLP may be an area for supplying a signal using a device, such as an auto probe, to test lighting of the display device 10. The lighting pad portion TLP may include a plurality of lighting pads for lighting the sub-pixels SPn of the display area DPA.

In some embodiments, the lighting pad portion TLP may include a first dummy pad electrode DPE1 and a second dummy pad electrode DPE2. The first dummy line DEL1 and the second dummy line DEL2 extending from the dummy pixel DSP may extend to the lighting pad portion TLP to be connected to the first dummy pad electrode DPE1 and the second dummy pad electrode DPE2. In some embodiments, the first dummy line DEL1 may be connected to the first dummy pad electrode DPE1 to supply a signal to the first dummy electrode 121 of the dummy pixel DSP. The second dummy line DEL2 may be connected to the second dummy pad electrode DPE2 to supply a signal to the second dummy electrode 122 of the dummy pixel DSP.

FIG. 12 illustrates the arrangement of the dummy electrodes 121 and 122, the light emitting element 30, and dummy contact electrodes 126 and 127 located in the emission area EMA of the dummy pixel DSP in the non-display area NDA, together with a schematic cross section of the first dummy pad electrode DPE1 of the lighting pad portion TLP. FIG. 12 is a diagram for illustrating a relative arrangement relationship between members located in the non-display area NDA and the lighting pad portion TLP, and the structure of the display device 10 is not limited thereto.

Referring to FIG. 12 together with FIGS. 10 and 11, the display device 10 may include the first substrate 11, the plurality of conductive layers located on the first substrate 11, and the plurality of insulating layers. In the following, portions overlapping with the description of FIGS. 4 to 8 will be briefly described.

A first interlayer insulating layer 17 may be located on the first substrate. The second data conductive layer may be located on the first interlayer insulating layer 17. The second data conductive layer may include the first dummy line DEL1 located in the non-display area NDA. A high potential voltage (or a first power voltage) supplied to the first dummy electrode 121 may be applied to the first dummy line DEL1. The first dummy line DEL1 may be connected to the first dummy electrode 121.

The first planarization layer 19 may be located on the second data conductive layer, although the first planarization layer 19 might not be located on the lighting pad portion TLP. In the display device 10 according to some embodiments, the first dummy pad electrode DPE1 and an insulating layer (e.g., the second insulating layer 52), which are arranged on the first dummy line DEL1 to cap the first dummy line DEL1 and to connect the first dummy line DEL1 to an external device, may be formed as the same layer as the layer located in the display area DPA and the non-display area NDA. In the display device 10 according to some embodiments, the first dummy pad electrode DPE1 located in the lighting pad portion TLP may be formed in the same process as the layer located in the display area DPA and the non-display area NDA.

The first planarization layer 19 is located on the second data conductive layer. The first planarization layer 19 may be entirely located in the non-display area NDA to perform a surface planarization function. The first planarization layer 19 might not be located in the lighting pad portion TLP to expose the first dummy line DEL1, or may be located only in a partial region of the lighting pad portion TLP. However, in some embodiments, the first planarization layer 19 may be omitted.

The plurality of first banks 40, the plurality of dummy electrodes 121 and 122, the light emitting element 30, the plurality of dummy contact electrodes 126 and 127, and the second bank 45 may be located on the first planarization layer 19 in the non-display area NDA. In addition, a plurality of insulating layers 151, 152, and 153 may be located on the first planarization layer 19. The first dummy pad electrodes DPE1 and the second insulating layer 52 may be located on the first dummy line DEL1 in the lighting pad portion TLP. Hereinafter, the dummy pixel DSP located in the non-display area NDA is first described, and then the first dummy line DEL1 and the first dummy pad electrode DPE1 located in the lighting pad portion TLP will be described.

The first banks 40 may be located on the first planarization layer 19 in the non-display area NDA. The first banks 40 may have a shape extending in the second direction DR2 within the dummy pixel DSP. Further, the plurality of first banks 40 may be located to be spaced apart from each other in the first direction DR1. The first banks 40 may have a corresponding width in the first direction DR1. Two first banks 40 may be partially located in the dummy pixel DSP, and may be spaced apart from each other so that the light emitting elements 30 may be located therebetween.

Two first banks 40 are located in the dummy pixel DSP in the drawing, but the present disclosure is not limited thereto. A larger number of first banks 40 may be further located according to the number of dummy electrodes 121 and 122 to be described later. In addition, the shape of the first bank 40 is not limited thereto, and may be arranged to occupy a smaller area in the dummy pixel DSP. In the following, the shape of the first bank 40 is the same as that described above with reference to FIG. 5, and thus the description thereof will be omitted The plurality of dummy electrodes 121 and 122 may be located on the first bank 40 and the first planarization layer 19. The plurality of dummy electrodes 121 and 122 may include the first dummy electrode 121 and the second dummy electrode 122. The first dummy electrode 121 and the second dummy electrode 122 may extend in the second direction DR2, and may be spaced apart from each other in the first direction DR1.

The first dummy electrode 121 and the second dummy electrode 122 may extend in the second direction DR2 within the dummy pixel DSP, but may end outside the second bank 45. The first dummy electrode 121 may be electrically connected to the first dummy line DEL1 through the third contact hole CT3, and the second dummy electrode 122 may be electrically connected to the second dummy line DEL2 through the fourth contact hole CT4. For example, the first dummy electrode 121 may contact the first dummy line DEL1 through the third contact hole CT3 penetrating the first planarization layer 19 at a portion of the second bank 45 extending in the second direction DR2. The second dummy electrode 122 may contact the second dummy line DEL2 through the fourth contact hole CT4 penetrating the first planarization layer 19 at a portion of the second bank 45 extending in the second direction DR2. However, the present disclosure is not limited thereto. In other embodiments, the third contact hole CT3 and the fourth contact hole CT4 may be located in the second emission area EMA2 surrounded by the second bank 45 so as not to overlap the second bank 45.

In the drawing, one first dummy electrode 121 and one second dummy electrode 122 are located in the dummy pixel DSP, but the present disclosure is not limited thereto. A larger number of the first dummy electrodes 212 and a larger number of the second dummy electrodes 122 may be located in the dummy pixel DSP. However, the structure of the first dummy electrode 121 and the second dummy electrode 122 located in the dummy pixel DSP may be substantially the same as the structure of the first electrode 21 and the second electrode 22 in the sub-pixels SPn located in the display area DPA described above. However, the first dummy electrode 121 and the second dummy electrode 122 may not overlap a transistor, unlike the sub-pixel SPn. A circuit structure such as a transistor or a capacitor may be omitted from the dummy pixel DSP.

The first dummy electrode 121 and the second dummy electrode 122 may be respectively located on the first banks 40. Each dummy electrode 121, 122 may include a conductive material having high reflectivity. Each dummy electrode 121, 122 may reflect, in the upward direction of the dummy pixel DSP, light emitted from the light emitting element 30 and traveling to the side surface of the first bank 40.

The plurality of dummy electrodes 121 and 122 may be electrically connected to the light emitting elements 30, and may be applied with a voltage (e.g., a predetermined voltage) to allow the light emitting elements 30 to emit light. The plurality of dummy electrodes 121 and 122 may be electrically connected to the light emitting element 30 through the dummy contact electrodes 126 and 127, and electrical signals applied to the dummy electrodes 121 and 122 may be transmitted to the light emitting element 30 through the dummy contact electrodes 126 and 127.

Further, each of the dummy electrodes 121 and 122 may be used to form an electric field in the dummy pixel DSP to align the light emitting elements 30. The light emitting element 30 may be located between the first dummy electrode 121 and the second dummy electrode 122 by the electric field formed on the first dummy electrode 121 and the second dummy electrode 122. The light emitting elements 30 of the display device 10 may be injected onto the dummy electrodes 121 and 122 through an inkjet printing process. When inks including the light emitting elements 30 are injected onto the dummy electrodes 121 and 122, an alignment signal is applied to the dummy electrodes 121 and 122 to generate the electric field. The light emitting elements 30 dispersed in the inks may be aligned on the dummy electrodes 121 and 122 by receiving the dielectrophoretic force by the electric field generated on the dummy electrodes 121 and 122.

A second pattern 170 may be located on the first planarization layer 19. The second pattern 170 may be located to not overlap the first bank 40 and to cover one end of the first dummy electrode 121 and one end of the second dummy electrode 122. Because the light emitting element 30 is formed on the second pattern 170, the reflection efficiency of light emitted from the light emitting element 30 may be improved.

In some embodiments, the second pattern 170 may correspond to the light emitting element 30 in a one-to-one manner. The second pattern 170 has a size that is sufficient to overlap one light emitting element 30, so that the light emitting element 30 may have a one-to-one correspondence to the second pattern 170. However, as illustrated in FIG. 13, in other embodiments, a plurality of second patterns 170 may be provided to correspond to one light emitting element 30. For example, two second patterns 170 may be arranged side by side in the first direction DR1, and may correspond to a single light emitting element 30. However, the present disclosure is not limited thereto, and three or more second patterns 170 may be provided.

In addition, the second pattern 170 may be formed in a rectangular shape. When the second pattern 170 is formed in a rectangular shape, the light emitting element 30 may be stably placed. However, the present disclosure is not limited thereto, and the second pattern 170 may be formed in a polygonal shape other than a rectangular shape, a circular shape, or the like.

The second bank 45 may be located on the first planarization layer 19. The second bank 45 may include portions extending in the first direction DR1 and the second direction DR2 in a plan view to be arranged in a rectangular pattern surrounding the dummy pixel DSP. The second bank 45 may be located to surround the dummy pixel DSP, and may not be located in the lighting pad portion TLP to expose the first dummy pad electrode DPE1.

The light emitting element 30 may be located on the second pattern 170. The plurality of light emitting elements 30 may be located to be spaced apart from each other along the second direction DR2 in which the dummy electrodes 121 and 122 extend, and may be aligned substantially parallel to each other. The light emitting elements 30 located in the dummy pixel DSP may emit light of a corresponding wavelength band to the outside. In some other embodiments, the light emitting elements 30 may include light emitting layers including different materials to emit light of different wavelength bands to the outside. In this case, a plurality of dummy pixels DSP may be arranged to emit light of a first color, a second color, and a third color.

Between the first banks 40, the light emitting element 30 may have respective ends located on the dummy electrodes 121 and 122. For example, the light emitting element 30 may be located such that one end is placed on the first dummy electrode 121, and such that the other end is placed on the second dummy electrode 122. Both ends of the light emitting element 30 may contact the dummy contact electrodes 126 and 127, respectively.

The first insulating layer 51 may be partially located on the light emitting element 30. For example, the first insulating layer 51 may have a width that is smaller than the length of the light emitting element 30, and may be located on the light emitting element 30 to expose both ends of the light emitting element 30 while surrounding the light emitting element 30. During the manufacturing process of the display device 10, the first insulating layer 51 may be arranged to cover the light emitting element 30 and the dummy electrodes 121 and 122, and then may be partially removed to expose both ends of the light emitting element 30. The first insulating layer 51 may extend in the first direction DR1 in a plan view to form a linear or island-like pattern in the dummy pixel DSP.

The plurality of dummy contact electrodes 126 and 127 may be located on the first insulating layer 51. The plurality of dummy contact electrodes 126 and 127 may have a shape extending in one direction, and may be located on the dummy electrodes 121 and 122, respectively. The dummy contact electrodes 126 and 127 may include a first dummy contact electrode 126 located on the first dummy electrode 121, and a second dummy contact electrode 127 located on the second dummy electrode 122. The dummy contact electrodes 126 and 127 may be located to be spaced apart from each other or opposite to each other.

The plurality of dummy contact electrodes 126 and 127 may each be in contact with the light emitting element 30. The first dummy contact electrode 126 may be in contact with one end of the light emitting element 30, and the second dummy contact electrode 127 may be in contact with the other end of the light emitting element 30. One side of each of the dummy contact electrodes 126 and 127 that is in contact with either end of the light emitting element 30 may be located on the first insulating layer 51.

In the drawing, two dummy contact electrodes 126 and 127 are located in the dummy pixel DSP, but the present disclosure is not limited thereto. The number of the dummy contact electrodes 126 and 127 may vary depending on the number of the dummy electrodes 121 and 122 located for each dummy pixel DSP, and may be the same as the number of the contact electrodes 26 and 27 of the sub-pixel SPn of the display area DPA.

The second insulating layer 52 is located on the first dummy contact electrode 126. The second insulating layer 52 may electrically insulate the first dummy contact electrode 126 and the second dummy contact electrode 127 from each other. The second insulating layer 52 may be located to cover the first dummy contact electrode 126, but might not be located on the other end of the light emitting element 30 such that the light emitting element 30 can be brought into contact with the second dummy contact electrode 127. The second insulating layer 52 may partially contact the first dummy contact electrode 126, as well as the first insulating layer 51, at the top surface of the first insulating layer 51. The side surface of the second insulating layer 52 in a direction in which the second dummy electrode 122 is located may be aligned with one side surface of the first insulating layer 51.

The second dummy contact electrode 127 may be located on the second dummy electrode 122, the first insulating layer 51, and the second insulating layer 52. The second dummy contact electrode 127 may be in contact with the other end of the light emitting element 30 and with the exposed top surface of the second dummy electrode 122. The other end of the light emitting element 30 may be electrically connected to the second dummy electrode 122 through the second dummy contact electrode 127.

The second dummy contact electrode 127 may partially contact the second pattern 170, the first insulating layer 51, the second insulating layer 52, the second dummy electrode 122, and the light emitting element 30. The first dummy contact electrode 126 and the second dummy contact electrode 127 might not contact each other due to configuration of the first insulating layer 51 and the second insulating layer 52. However, the present disclosure is not limited thereto, and in some cases, the second insulating layer 52 may be omitted.

The third insulating layer 53 may be entirely located in the non-display area DPA. The third insulating layer 53 may function to protect a lower structure against the external environment. However, the third insulating layer 53 may be omitted in other embodiments.

The dummy pixel DSP located in the non-display area NDA may include the dummy electrodes 121 and 122, the light emitting element 30, and the dummy contact electrodes 126 and 127 to emit light of a corresponding wavelength band.

The lighting pad portion TLP may include the dummy pad electrodes DPE1 and DPE2, which transmit a driving signal for driving the dummy pixel DSP. An external power supply, such as an auto probe, may be connected to the dummy pad electrodes DPE1 and DPE2 of the lighting pad portion TLP. Hereinafter, a description will be given of the dummy lines DEL1 and DEL2, and the dummy pad electrodes DPE1 and DPE2 located in the lighting pad portion TLP.

The dummy lines DEL1 and DEL2 may be located on the first interlayer insulating layer 17 of the lighting pad portion TLP. The dummy lines DEL1 and DEL2 may be located on the same layer as the second data conductive layer. The dummy pad electrodes DPE1 and DPE2 may be located on the dummy lines DEL1 and DEL2.

The second insulating layer 52 may be located in the lighting pad portion TLP. In one example, the second insulating layer 52 is located on the first dummy line DEL1 to cover it, and may include a pad opening OP that exposes a portion of the top surface of the first dummy line DEL1. In addition, in some embodiments, the second insulating layer 52 may have a width that is larger than that of the first dummy line DEL1 to be in contact with the side surfaces of the first dummy line DEL1, and the bottom surface of the second insulating layer 52 may be partially located directly on the first interlayer insulating layer 17.

The dummy pad electrodes DPE1 and DPE2 may be located on the second insulating layer 52. For example, the first dummy pad electrode DPE1 is located to cover the pad opening OP of the second insulating layer 52, and may directly contact a portion of the top surface of the first dummy line DEL1 exposed by the pad opening OP. The first dummy pad electrode DPE1 may have substantially the same width as the first dummy line DEL1. However, the present disclosure is not limited thereto, and the first dummy pad electrode DPE1 may have a width that is larger than or that is smaller than that of the first dummy line DEL1. The first dummy pad electrode DPE1 may electrically connect the external power supply to the first dummy line DEL1.

According to some embodiments, the dummy pad electrodes DPE1 and DPE2 may be formed in the same process as the dummy contact electrodes 126 and 127 of the non-display area NDA, and may include the same material as them. In addition, according to some embodiments, only the second insulating layer 52 is located between the dummy pad electrodes DPE1 and DPE2 and the dummy lines DEL1 and DEL2 in the lighting pad portion TLP, thereby reducing or minimizing the height difference in the pad electrodes due to the insulating layer. In some embodiments, the thickness of the second insulating layer 52 is in the range of about 0.2 µm to about 0.6 µm, preferably around 0.3 µm, thereby reducing or preventing the likelihood of a contact failure between the external power supply and the dummy pad electrodes DPE1 and DPE2.

In the dummy pixel DSP having such a structure, ink IN (see FIG. 14) including the light emitting elements 30 may be applied, and the light emitting elements 30 may be aligned on the second pattern 170.

Figure 14:
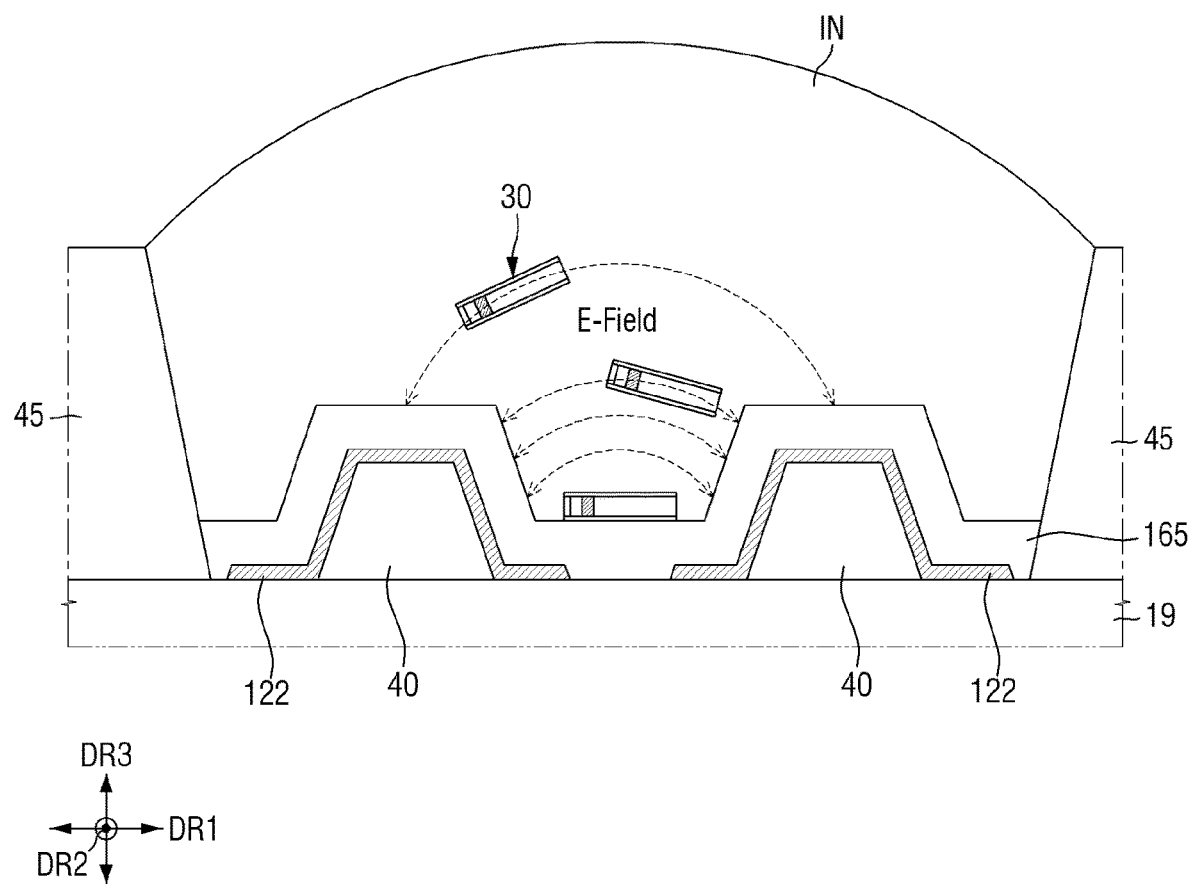
FIGS. 14 and 15 are schematic cross-sectional views illustrating an arrangement of light emitting elements in a manufacturing process of a display device according to some embodiments.
Figure 15:
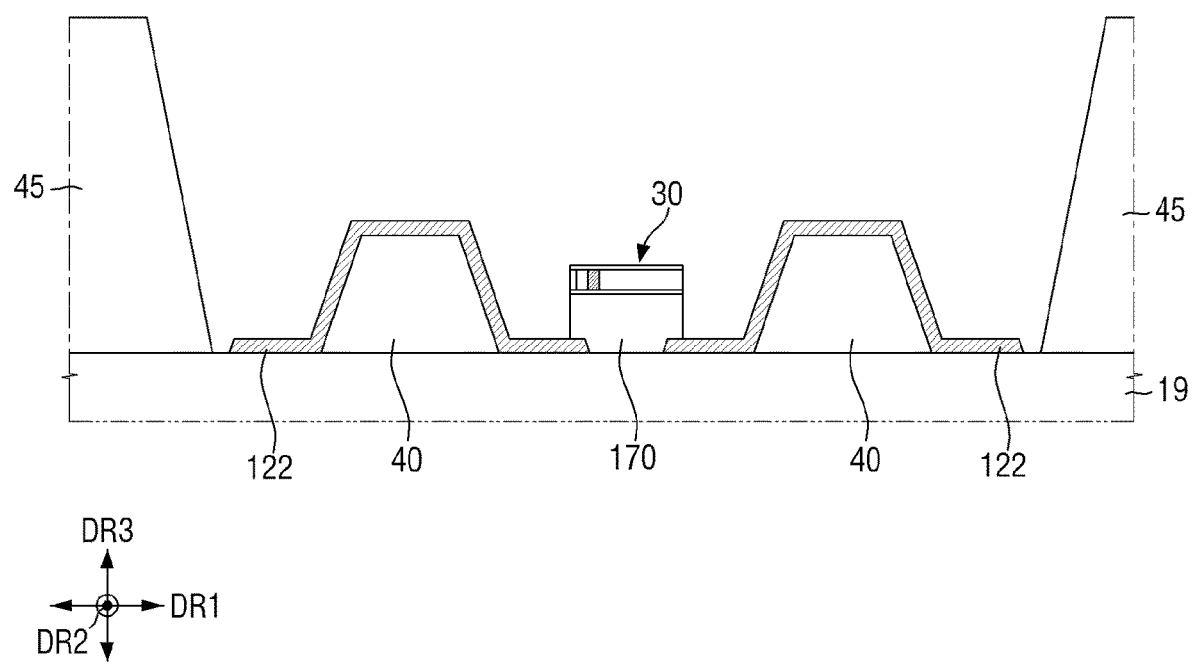

FIGS. 14 and 15 are schematic cross-sectional views illustrating an arrangement of light emitting elements in a manufacturing process of a display device according to some embodiments.

Referring to FIG. 14, the first banks 40 are formed on the first planarization layer 19, and the first dummy electrode 121 and the second dummy electrode 122 are formed on the first banks 40, respectively. Subsequently, the second bank 45 is formed on the first planarization layer 19. The second bank 45 may be formed to surround the first banks 40, the first dummy electrode 121 and the second dummy electrode 122. Then, a pattern insulating layer 165 is stacked on the first planarization layer 19. The pattern insulating layer 165 may cover the first dummy electrode 121 and the second dummy electrode 122.

Subsequently, the plurality of light emitting elements 30 are located between the first banks 40. The light emitting elements 30 may be injected into an area partitioned by the second bank 45 while in a state of being dispersed in the ink IN. In some embodiments, the light emitting elements 30 are prepared in a state of being dispersed in the ink IN containing a solvent, and may be injected through a printing process using an inkjet printing device. The inks injected through the inkjet printing device may settle in an area surrounded by the second bank 45. The second bank 45 may reduce or prevent the ink IN from overflowing therefrom.

When the ink IN including the plurality of light emitting elements 30 is injected, electrical signals are applied to the first dummy electrode 121 and the second dummy electrode 122 to align the plurality of light emitting elements 30 on the pattern insulating layer 165. The electrical signals may be applied to the first dummy electrode 121 and the second dummy electrode 122 from the external power supply. In some embodiments, the electrical signals may be applied by bringing an auto probe into contact with the first dummy pad electrode DPE1 and the second dummy pad electrode DPE2 located in the lighting pad portion (TLP in FIG. 11). The electrical signal applied to the first dummy pad electrode DPE1 may be transmitted to the first dummy electrode 121 through the first dummy line DEL1 connected to the first dummy pad electrode DPE1. The electrical signal applied to the second dummy pad electrode DPE2 may be transmitted to the second dummy electrode 122 through the second dummy line DEL2 connected to the second dummy pad electrode DPE2.

When the electrical signal (e.g., a current) is passed through the first dummy electrode 121 and the second dummy electrode 122, an electric field E-Field may be generated on the first dummy electrode 121 and the second dummy electrode 122. When an alternating current signal is applied to one of the first dummy electrode 121 and the second dummy electrode 122, a dipole moment is generated in the light emitting elements 30 dispersed in the ink IN. In response to the generated electric field, a rotation torque is generated to align the light emitting elements 30 in which the dipole moment has been generated. In addition, the light emitting element 30 may be subjected to a dielectrophoretic force FDEP by the electric field. The light emitting element 30 having been subjected to the dielectrophoretic force may move to a side where the electric field intensity is large, and may be placed on the pattern insulating layer 165 such that both ends thereof overlap the first dummy electrode 121 and the second dummy electrode 122.

Next, as shown in FIG. 15, the second pattern 170 may be formed by etching and patterning the pattern insulating layer 165. Thereafter, as shown in FIG. 12, the first insulating layer 51, the first dummy contact electrode 126, the second insulating layer 52, the second dummy contact electrode 127, and the third insulating layer 53 may be formed to manufacture the dummy pixel DSP.

According to some embodiments, in the dummy pixel DSP, the height, alignment degree, and luminance of the light emitting element 30 may be measured. To allow the light emitting element 30 to emit light, the sub-pixels SPn located in the display area DPA may be provided with a plurality of transistors, a capacitor, and a plurality of signal lines below the light emitting element 30. However, in the sub-pixels SPn located in the display area DPA, the height or alignment degree of the light emitting element 30 measured by the optical device may have low accuracy due to light reflected from lower circuits. The dummy pixel DSP according to some embodiments may use a signal of the lighting pad portion TLP to allow the light emitting element 30 to emit light, instead of including a complicated circuit. Therefore, the structure above the first planarization layer 19 in the dummy pixel DSP is configured to be the same as that in the sub-pixel SPn, and then the height and alignment degree of the light emitting element 30 in the dummy pixel DSP are measured, thereby increasing the accuracy of the measurement.

In other words, in the display device 10 including the dummy pixel DSP according to some embodiments, the alignment degree and luminance of the light emitting elements 30 in the dummy pixel DSP are measured, thereby monitoring the height, alignment degree, and luminance of the light emitting elements 30 in the sub-pixels SPn in the display area DPA. That is, in the present example, the dummy pixel DSP having no complicated circuit below the light emitting element 30 is provided, so that the height and alignment of the light emitting element 30 may be more accurately measured.

In addition, in the disclosed embodiments, the luminance of the light emitting element 30 is measured, and the height of the light emitting element 30 may be analyzed through the luminance. As described above, when the light emitting element 30 is located on the second pattern 170, which is relatively high, the reflection efficiency in which light emitted from the light emitting element 30 is reflected from the dummy electrodes 121 and 122 may increase, which may result in an increase in luminance. In some embodiments, after accumulating the height data of the light emitting element 30 corresponding to the luminance value thereof, the luminance of the light emitting element 30 is measured. Then, the height of the light emitting element 30 corresponding to the luminance value can be easily determined.

In concluding the detailed description, those skilled in the art will appreciate that many variations and modifications can be made to the preferred embodiments without substantially departing from the aspects of the present disclosure. Therefore, the disclosed embodiments of the disclosure are used in a generic and descriptive sense only and not for purposes of limitation.

What is claimed is:

1. A display device comprising:
   a first substrate comprising a display area and a non-display area;
   first banks spaced apart from each other in the display area and in the non-display area on the first substrate;
   electrodes spaced apart from each other on the first banks in the display area;
   dummy electrodes spaced apart from each other on the first banks in the non-display area;
   a first pattern between the electrodes in the display area;
   a second pattern between the dummy electrodes in the non-display area;
   a first light emitting element on the first pattern;
   a second light emitting element on the second pattern;
   contact electrodes respectively on the electrodes in the display area to contact one end of the first light emitting element; and
   dummy contact electrodes respectively on the dummy electrodes in the non-display area to contact one end of the second light emitting element.

2. The display device of claim 1, wherein the dummy electrodes, the second pattern, the second light emitting element, and the dummy contact electrodes are each comprised in at least one dummy pixel.

3. The display device of claim 2, wherein the dummy pixel is in the non-display area, and is adjacent to at least one corner of the display area.

4. The display device of claim 3, wherein the at least one dummy pixel comprises four dummy pixels that are respectively adjacent to four corners of the display area.

5. The display device of claim 2, wherein the dummy electrodes comprise a first dummy electrode, and a second dummy electrode spaced apart from the first dummy electrode, and
   wherein one end of the first dummy electrode and one end of the second dummy electrode overlaps the second light emitting element.

6. The display device of claim 5, further comprising a lighting pad portion in the non-display area, and comprising a first dummy pad electrode, and a second dummy pad electrode spaced apart from the first dummy pad electrode.

7. The display device of claim 6, further comprising:
   a first dummy line connecting the first dummy pad electrode to the first dummy electrode; and
   a second dummy line connecting the second dummy pad electrode to the second dummy electrode,
   wherein the first and second dummy lines are between the lighting pad portion and the dummy pixel.

8. The display device of claim 1, wherein at least one of the electrodes overlaps a transistor on the first substrate, and
   wherein at least one of the dummy electrodes does not overlap the transistor.

9. The display device of claim 1, wherein the first pattern covers one end of the electrodes, and
   wherein the second pattern covers one end of the dummy electrodes.

10. The display device of claim 1, wherein the first pattern is in plural number between the electrodes, and
    wherein the second pattern is in plural number between the dummy electrodes.

11. The display device of claim 10, wherein the electrodes and the dummy electrodes are to extend in one direction, and
    wherein the second pattern is in plural number in a direction crossing the one direction.

12. A display device comprising:
    a first substrate comprising a display area and a non-display area, the non-display area comprising a dummy pixel and a lighting pad portion,
    wherein the dummy pixel comprises:
      first banks on the first substrate and spaced apart from each other;
      dummy electrodes on the first banks and spaced apart from each other;
      a second pattern between the dummy electrodes;
      a light emitting element on the second pattern; and
      dummy contact electrodes respectively on the dummy electrodes to contact the light emitting element, and
    wherein the lighting pad portion comprises:
      dummy lines connected to the dummy electrodes on the first substrate; and
      dummy pad electrodes on the dummy lines and connected to the dummy lines.

13. The display device of claim 12, further comprising at least one signal line on the first substrate in the non-display area,
    wherein the dummy lines and the at least one signal line are insulated from each other and cross each other.

14. The display device of claim 13, wherein the dummy pixel does not overlap the at least one signal line.

15. The display device of claim 12, wherein the dummy electrodes comprise a first dummy electrode, and a second dummy electrode spaced apart from the first dummy electrode,
    wherein the dummy lines comprise a first dummy line, and a second dummy line spaced apart from the first dummy line, and wherein the dummy pad electrodes comprise a first dummy pad electrode, and a second dummy pad electrode spaced apart from the first dummy pad electrode.

16. The display device of claim 15, wherein the first dummy electrode is connected to the first dummy pad electrode through the first dummy line, and wherein the second dummy electrode is connected to the second dummy pad electrode through the second dummy line.

17. The display device of claim 16, further comprising at least one insulating layer between the first dummy pad electrode and the first dummy line, and between the second dummy pad electrode and the second dummy line, wherein the first and second dummy pad electrodes are respectively connected to the first and second dummy lines through contact holes penetrating the insulating layer.

18. The display device of claim 12, wherein the second pattern is in plural number between the dummy electrodes.

19. The display device of claim 18, wherein the dummy electrodes extend in one direction, and wherein the second pattern is in plural number in a direction crossing the one direction.

20. The display device of claim 12, wherein the light emitting element comprises a first semiconductor layer, a second semiconductor layer, and at least one light emitting layer between the first semiconductor layer and the second semiconductor layer, and wherein the first semiconductor layer, the second semiconductor layer, and the at least one light emitting layer are surrounded by an insulating film.

* * * * *